(12) United States Patent
Kragl

(10) Patent No.: US 6,832,861 B2
(45) Date of Patent: Dec. 21, 2004

(54) COUPLING DEVICE FOR OPTICALLY COUPLING AN OPTICAL WAVEGUIDE TO AN ELECTRO-OPTICAL ELEMENT

(75) Inventor: Hans Kragl, Diekholzen (DE)

(73) Assignee: DieMount GmbH, Erfurt (DE)

( * ) Notice: Subject to any disclaimer, the term of this patent is extended or adjusted under 35 U.S.C. 154(b) by 50 days.

(21) Appl. No.: 10/608,922

(22) Filed: Jun. 27, 2003

(65) Prior Publication Data

US 2004/0008952 A1 Jan. 15, 2004

Related U.S. Application Data

(63) Continuation of application No. PCT/EP01/15153, filed on Dec. 20, 2001.

(30) Foreign Application Priority Data

Dec. 29, 2000 (DE) ......................................... 100 65 624

(51) Int. Cl.[7] ............................. G02B 6/00; G02B 6/36
(52) U.S. Cl. ......................................... 385/88; 385/147
(58) Field of Search ............................. 385/88–90, 147

(56) References Cited

U.S. PATENT DOCUMENTS

| | | | |
|---|---|---|---|
| 4,647,331 A | 3/1987 | Koury et al. | |
| 4,945,400 A | 7/1990 | Blonder et al. | |
| 5,028,110 A | 7/1991 | Plummer | |
| 5,349,234 A | 9/1994 | DesJardin et al. | |
| 5,434,939 A | 7/1995 | Matsuda | |
| 5,645,977 A | 7/1997 | Wu et al. | |
| 5,660,461 A | 8/1997 | Ignatius et al. | |
| 5,675,678 A | 10/1997 | Neuberger et al. | |
| 5,737,467 A | 4/1998 | Kato et al. | |

(List continued on next page.)

FOREIGN PATENT DOCUMENTS

| | | |
|---|---|---|
| DE | 33 39 189 A1 | 5/1985 |
| DE | 38 24 395 C2 | 11/1989 |
| DE | 38 34 395 | 4/1990 |
| DE | 195 42 658 A1 | 5/1997 |
| DE | 196 02 079 C1 | 5/1997 |
| DE | 198 51 265 A | 5/2000 |
| DE | 198 52 832 A | 5/2000 |
| EP | 0 611 975 A1 | 2/1989 |
| EP | 0 571 907 A2 | 5/1993 |
| EP | 1 002 696 A2 | 11/1999 |
| WO | WO 96/22177 | 7/1996 |
| WO | WO 98/26885 | 6/1998 |
| WO | WO 00/28362 | 5/2000 |
| WO | WO 00/57492 | 9/2000 |

OTHER PUBLICATIONS

Kragl, H. et al.; MICROMID: A low cost fabrication technology for polymer fiber transceiver modules. POF Conference 2000, Boston, U.S.A., no date.

Kragl, H. et al., "Microstructured three–dimensional printed circuit boards: a novel fabrication technology for optical transceiver modules," Proceedings, MICRO.tec 2000; VDE World Microtechnologies Congress; vol. 1, pp. 107–110, no date.

*Primary Examiner*—Akm Enayet Ullah
(74) *Attorney, Agent, or Firm*—Jansson, Shupe & Munger, Ltd.

(57) ABSTRACT

For a precisely fitting alignment of an optical waveguide on an electro-optical component, the electro-optical component is attached onto a submount, which can be attached at any position on a support. For retaining the optical waveguide, a coupling element is selectively provided, the coupling element having a negative imaging of the contour of the submount. This element is positively attached at the submount and receives the end of the optical waveguide. The space between the electro-optical component and the optical waveguide is filled by a transparent adhesive. The submount can be formed in micro-structure technique. The coupling element can be eliminated if the optical waveguide is directly aligned on the submount.

17 Claims, 16 Drawing Sheets

U.S. PATENT DOCUMENTS

| | | |
|---|---|---|
| 5,795,519 A | 8/1998 | Bacher et al. |
| 5,987,202 A | 11/1999 | Gruenwald et al. |
| 5,993,075 A | 11/1999 | Huang et al. |
| 6,004,046 A | 12/1999 | Sawada |
| 6,070,315 A | 6/2000 | Schubert et al. |
| 6,504,107 B1 | 1/2003 | Kragl |
| 6,646,777 B2 * | 11/2003 | Qin et al. ............ 359/281 |
| 6,647,039 B2 * | 11/2003 | Fu et al. ............. 372/36 |
| 6,653,557 B2 * | 11/2003 | Wolf et al. ........... 174/35 R |
| 2001/0007526 A1 | 7/2001 | Ohkohdo et al. |
| 2003/0159280 A1 * | 8/2003 | Young et al. .......... 29/840 |
| 2003/0159772 A1 * | 8/2003 | Wolf et al. ........... 156/182 |
| 2003/0159844 A1 * | 8/2003 | Wolf et al. ........... 174/35 R |
| 2003/0161133 A1 * | 8/2003 | Fu et al. ............. 361/821 |
| 2003/0174454 A1 * | 9/2003 | Fu et al. ............. 361/103 |

* cited by examiner

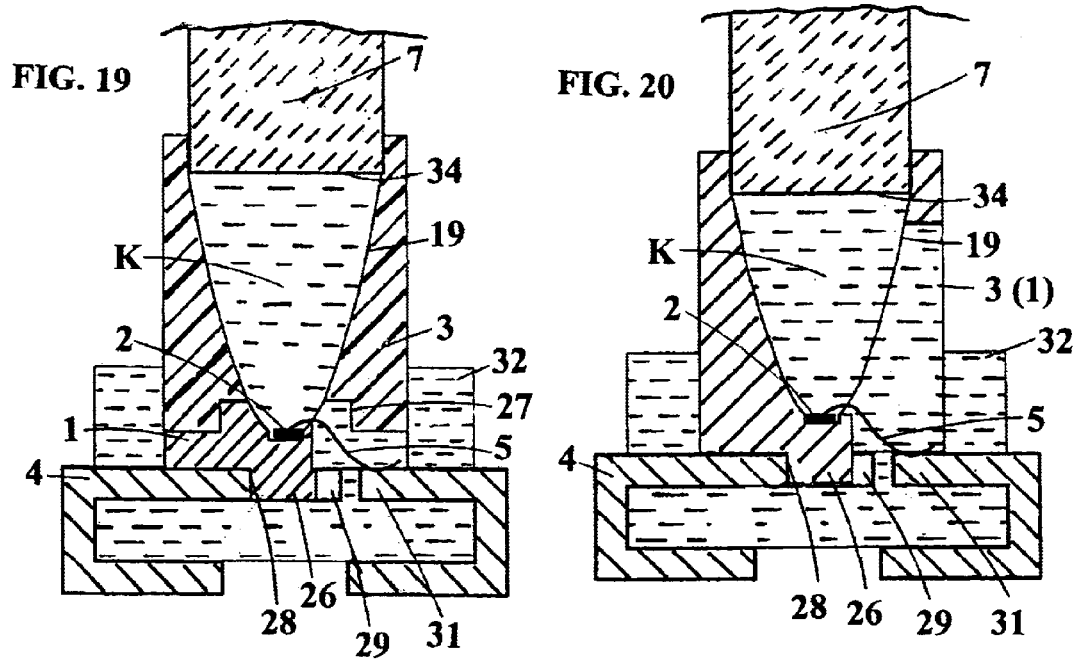
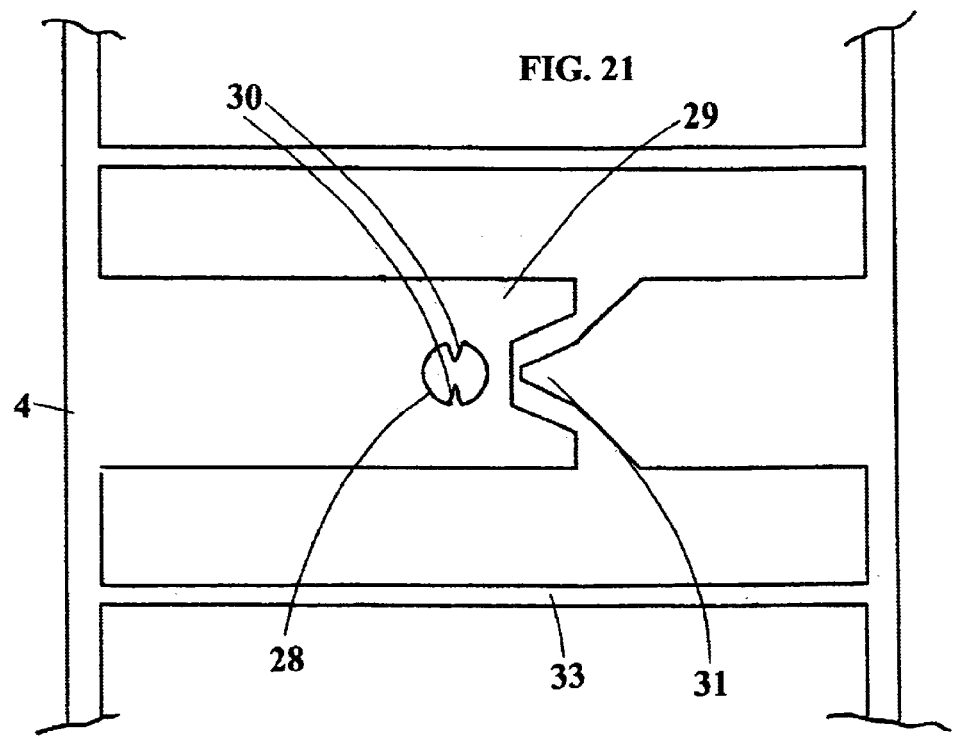

COUPLING DEVICE FOR OPTICALLY COUPLING AN OPTICAL WAVEGUIDE TO AN ELECTRO-OPTICAL ELEMENT

CROSS REFERENCE TO RELATED APPLICATION

This application is a continuation of P.C.T. application PCT/EP01/15153, filed Dec. 20, 2001 by inventor Hans Kragl, titled, "Coupling Arrangement for Optically Coupling an Optical Waveguide Comprising an Electro-optical or Opto-electrical Semiconductor Converter," and claims priority to German application DE 100 65 624.2, filed Dec. 29, 2000.

BACKGROUND OF THE INVENTION

1. Field of the Invention

The communications industry's conversion from electrical to optical communications engineering has accelerated the demand for and the requirements of optical transceiver modules in all fields of data transmission. Both high-rate optical transmission technology on long-distance lines via glass fibers, as well as optical transmission technology with comparatively lower data rates via relatively "thick" polymer fibers or hybrid glass/polymer fibers (so-called HCS fibers), are increasingly used. In the former case, hundreds of kilometers are typical, whereas only some 10 to 100 m are transmitted at data rates of a maximum of some 100 MB/s in the latter case. Systems of this second type are used within mobile means (motor vehicles, railway, airplanes) or for the so-called in-house linkage, i.e., within a building, such as for the data connection of all multi-media devices existing in a house (TV, internet, video recorder, audio devices, PCs, etc.). For cost reasons these networks do often not operate with laser diodes but instead are operated using simple surface light emitting light diodes (LEDs). For coupling such an LED to a relatively thick optical waveguide, a very inexpensive structure may be used, although significant precision is still required. An electro-optical module that contains the coupling point from the LED transmitter to the waveguide or from the photo diode receiver to the optical waveguide, is called optical transceiver.

2. Technical Background of the Invention

For a coupling of a surface-emitting LED and a relatively thick polymer fiber optical waveguide, generally two constructions exist, namely constructions without beam formation and constructions with beam formation. It is noted by way of non-limiting example that typical dimensions may be $250 \times 250$ $\mu m^2$ for the LED and 1000 $\mu m$ diameter for the polymer fibers. Beam formation means that some or all of the light rays emitted by the LED are changed in their propagation through lenses or curved mirrors so that a higher light portion can be coupled into the optical waveguide compared to a case where such measures are not taken. In any case, the alignment of the optical waveguide to the LED requires a high precision in view of the relevant dimensions, such as those given by example above.

One approach for this type of coupling is presented by the MicroMID technology which has recently become known. An example of this technology is described in DE 198 51 265 A1. Here, a micro-structured plastic support is used, the shape of the support being capable of being designed very flexibly. The manufacture of a reflector for the LED while simultaneously manufacturing an electronic circuit on the substrate is possible. An adjustment of the optical waveguide is implemented by means of a three-dimensional structure formed on the substrate. However, the high equipment costs of this technology are disadvantageous so that only the manufacture of large numbers of pieces justifies their use. Finally, since in the MicroMID technology the electronic circuit of the transceiver must be imaged in conformity with the injection molding tool, the technology is cumbersome in attempting to adapt to client-specific variants of the circuit. An adjustment is implemented between LED and optical waveguide in a structure ordered from LED to micro-structured printed circuit board to fiber plate to optical waveguide. Publications with respect to the MicroMID process can be found in Kragl, H. et. al.: "MICROMID: A low cost fabrication technology for polymer fiber transceiver modules", POF Conference 2000, Boston, and in Kragl, H. et. al.: "Microstructured three-dimensional printed circuit boards: a novel fabrication technology for optical transceiver modules", Proc. MicroTec 2000 Conference, Hannover.

For coupling an optical fiber and an LED, a coupling device where the LED optically opposes the end face of the fiber is known from DE 38 34 395 C2. The LED is fixedly connected to a support and is electrically connected by a bond wire to a conductor formed on the support. A coupling element is connected to the support and receives the end portion of the optical fiber. The LED is directly arranged on a planar electrode, namely a so-called lead frame. The coupling element receives the end of an optical fiber, the optical fiber having a free end face to be opposed to the LED, the coupling element having a type of a column which comprises sections matching with the conductors of the lead frame, so that these conductors are received in the sections. The LED is attached on the one conductor, whereas the other conductor is connected to the LED through a bond wire. In order to attach the LED on the lead frame in a highly precise manner, an optical pattern detection process is required, which proceeds so slowly that a use in mass production must be ruled out. If, however, the placing of the semiconductor element is left to a mass die bonder, a tolerance in the range of 50 $\mu m$ to 70 $\mu m$ must be accepted. When attaching the coupling element to the lead frame, there is some likelihood that the lead frame will be damaged, and the bond wire can be damaged even more easily. If this is to be avoided, additional tolerances must be taken into consideration so that, in the case of mass production, an overall tolerance of 200 $\mu m$ must be taken into consideration.

A coupling arrangement for coupling an optical waveguide to an opto-electronic device, e.g. a light emitting diode or a photo diode, is known from EP 0 611 975 A1. This coupling arrangement uses a cuboid base member made of a silicon monocrystal and a cuboid cover member also made of a silicon monocrystal, the cover member planarly lying thereon. A V-shaped groove for receiving the uncovered end of an optical waveguide is formed in the base member, the groove ending in a reflecting, oblique surface inclined by 45°. On the end of the groove opposite to the oblique surface, this groove opens into a V-shaped groove of a larger cross section, which provides for the accommodation of the covered section of the optical waveguide and which extends up to an edge of the base member. In the area over the oblique surface, the opto-electronic device is attached on the base member. The cover member comprises on its side facing the base member a V-shaped groove whose cross section corresponds to the larger cross section of the V-shaped groove in the base member. In the area in which the semiconductor component is located, the cover member has a recess, which offers space for the accommodation of the opto-electronic device. The orientation of the base member and the cover member on each other is carried out by means of two spheres, which are received in matching pyramid-shaped recesses formed in the base member and in the cover member. The cover member has two openings through which a casting compound can be filled into the area of the electro-optical device and the covered optical waveguide. This publication does not provide any clue regarding how the opto-electronic device is aligned on the reflecting oblique surface to obtain the desired accuracy that is defined by +/−1 μm.

A laser-glass fiber coupling and a method of establishing such a coupling connection is known from DE 33 39 189 A1. In this coupling arrangement, the coupling point is encapsuled with a curing resin mass to obtain optically favorable relations and to obtain a device for coupling a semiconductor and a fiber optical waveguide that is insensitive against environmental influences.

An optical coupling between an optical semiconductor and a fiber optical waveguide is known from U.S. Pat. No. 6,004,046. This arrangement uses a paraboloid mirror, not only bundling the light rays emitted by the optical semiconductor, but also at the same time deflecting them by 90°.

SUMMARY OF THE INVENTION

An object of the invention is to provide a coupling arrangement for optically coupling an end of an optical waveguide with at least one electro-optical or opto-electrical element and a method suitable for the manufacture thereof, so that a light-emitting and/or light-receiving semiconductor component may be aligned in a highly precise alignment achieved in a technically simple manner.

According to an aspect of the invention, an optical coupler for optically coupling an optical waveguide, having an end portion, with at least one electro-optical or opto-electrical semiconductor element that optically opposes an end face of the end portion, the optical waveguide being insertable into the optical coupler, includes: a support having at least one conductor formed thereon; at least one semiconductor element disposed to optically oppose the end face of the waveguide, the semiconductor element being fixedly connected to the support; a bond wire electrically connecting the semiconductor element to the conductor; a coupling element connected to the support and adapted to receive the end portion of the optical waveguide; a submount having a top and bottom side, the submount being fixed at its bottom side to the support, the submount having on its top side an adjustment structure in the form of a recess adapted for precise adjustment of the semiconductor element; and a transparent adhesive, wherein the semiconductor element is fixed in a thermally conductive manner to the submount, the coupling element is positively aligned on the submount, at least that conductor of the support onto which the bond wire is connected is electrically isolated from the submount, and wherein a space, between the semiconductor element and the end face of an optical waveguide to be inserted, is adapted to be filled by the transparent adhesive.

According to another aspect of the present invention, a coupling arrangement includes: a waveguide having an end portion including an end face; a support having at least one conductor formed thereon; at least one semiconductor element, the semiconductor element being one of an electro-optical type and an opto-electrical type, the semiconductor element being disposed to optically oppose the end face of the waveguide, the semiconductor element being fixedly connected to the support; a bond wire electrically connecting the semiconductor element to the conductor; a coupling element connected to the support and adapted to receive the end portion of the waveguide; a submount having a top and bottom side, the submount being fixed at its bottom side to the support, the submount having on its top side an adjustment structure in the form of a recess adapted for precise adjustment of the semiconductor element; and a transparent adhesive, wherein the semiconductor element is fixed in a thermally conductive manner to the submount, the coupling element is positively aligned on the submount, at least that conductor of the support onto which the bond wire is connected is electrically isolated from the submount, and wherein a space between the semiconductor element and the end face of the waveguide is filled by the transparent adhesive.

In various embodiments of the invention, the coupling arrangement may be adapted so that the end portion of the waveguide is able to be inserted into the recess of the submount without tolerance. An optical path may be defined for the semiconductor element, and the coupling arrangement may include a beam-forming metallic reflector surrounding the optical path of the semiconductor element, the beam-forming metallic reflector being arranged between the semiconductor element and the end face of the waveguide. The reflector may include a metal layer disposed on surfaces of the submount surrounding the semiconductor element. The reflector may include a metal layer formed on a wall of the coupling element between the end face of the waveguide and an end portion of the coupling element adjoining the semiconductor element. The reflector may include a metal layer formed on a wall of the coupling element between the end face of the waveguide and an end portion of the coupling element adjoining the semiconductor element. The coupling arrangement may also include at least one cutout for accommodating at least one bond wire extending from the semiconductor element, the cutout being formed in at least one of the coupling element and the submount. In an optical coupling arrangement, the optical path may be further defined as being between the semiconductor element and the end face of the waveguide, and the reflector may be formed to deflect the optical path by 90°. The waveguide may include a glass fiber. The end portion of the waveguide may be inserted so that it adjoins the semiconductor element, and the end portion may be adapted to be held by a highly precise ferrule receivably disposed in the recess formed in the submount. The submount may be electrically conductive, the semiconductor element may be electrically connected to the submount, and the bottom side of the submount may be electrically connected to the support. These exemplary embodiments, those discussed below, and others may be employed for obtaining various advantages.

In various additional exemplary embodiments, the invention provides an arrangement for optically coupling an optical semiconductor element, e.g. a transmission diode, to an optical waveguide having a submount on which the semiconductor element is positioned. The submount and the coupling element may contain beam-forming reflectors. The submount may be directly set onto a support, which may, for example, be a conventional printed circuit board, a TO housing, a lead frame, or a Molded Interconnect Device (MID) support. At least one bond wire is guided from the semiconductor element onto the support, which, if it is not conductive itself, is provided with a conductor to which the bond wire can be connected. An adjustment of the optical waveguide with respect to the semiconductor element may be implemented by adjusting the optical waveguide at the submount, either directly or by means of a separate coupling element, which in turn may be aligned precisely onto the semiconductor element by interlocking connection with the submount.

The submount may be made of a metal or of plastic with a surface metallization and it may directly establish the electrical connection between the support and an electrode of the semiconductor component. It may also be made of an insulating material, such as microstructured ceramics. In any case, is it favorable if the submount is heat-conductive in order to favorably discharge the heat emitted by the semiconductor component. It is evident that if the submount does not serve for the electrical connection to one of the electrodes of the semiconductor component, the semiconductor component may alternately be electrically connected by means of at least two bond wires.

The coupling element may be particularly used for coupling fiber conductors and in that case preferably consists of a thermoplastically-made plastic body with a cylindrical bore in an upper, first segment, which may taper in a second, lower segment in the form similar to a paraboloid of rotation. In such a case, the inner wall of the paraboloid may then advantageously be coated in a reflecting way, e.g., by coating with a thin silver layer. As an alternative, the coupling element may be formed as a massive metal member, e.g., made of silver, aluminum or copper, the latter preferably being formed with a reflecting coating made by deep drawing. In the case of higher volume manufacturing runs, the deep drawing of parts of soft metals may be more inexpensive than the injection molding of such parts.

Regarding the above-mentioned exemplary embodiment having a paraboloid form, a recess may be formed on the base point of the paraboloid, the edge contour of the recess being substantially congruent with the outer contour of the submount. Such a structure may be used to positively accommodate the submount and to thereby align the coupling element at the submount. Moreover, it may have at least one recess for receiving one or several bond wires, the latter being used, for example, when the submount is used for insulating as noted above.

In another exemplary aspect of the present invention, an assembly of a coupling device may include the following steps. A first step may include attaching a submount on a support having a surface suitable for wire bonding at a position provided for this purpose. The submount, for example, may be soldered or adhered-on with conductive adhesive. An attachment may be made by use of a projection (e.g., a pin) formed on the submount on the side opposing the semiconductor component, the projection being seated and secured in a recess or hole. The semiconductor element may be attached onto the submount by use of die bonding where, depending on the required precision, an adjustment structure arranged in the submount may be used. A second step may include electrically connecting the semiconductor component to a conductor on the support by wire bonding starting out from the semiconductor component. When using a coupling element, the coupling element may be set onto the submount and aligned in a manner that allows the semiconductor component to look through an opening of the coupling element provided for this purpose. The coupling element may have an adjustment structure allowing it to be precisely fit onto the submount, thereby exactly positioning the semiconductor component. Of course, damage of the bond wire or the bond wires must not occur during adjustment. In order to avoid the danger of a bond wire damage, the submount may also have a lateral bond wire protection or any other suitable manner of protection. In a preferred embodiment, when the coupling element is correctly seated on the support, it is non-detachable and is preferably impervious to fluids that may be present in this position, such as fluids used for manufacturing the support and the submount, e.g., by adhesion. A third step may include inserting a transparent adhesive into the submount, such as by filling. This may be achieved, for example, by filling the submount the fiber guide hole of the coupling element, the adhesive also flowing into the section in which the bond wire extends, thereby also enclosing the bond wire there. A fourth step may include inserting the optical waveguide so that its end is brought into contact with the adhesive whereby it is adhered to the adhesive that is still soft. If a coupling element is missing, the optical waveguide directly aligns at the submount. If a coupling element is used, the alignment at the submount may be carried out by use of the coupling element. As an alternative, it is also possible to use a plug of a non-adhesive material instead of using the optical waveguide, such a plug staying at its position until the adhesive has cured and being then replaced by the optical waveguide. This alternative allows the optical waveguide to be exchanged at a later time.

In a preferred method of assembly, if a suitable projection is being provided in the coupling element or at the submount (for example, when an annular shoulder is provided in the coupling element) where the end face of the optical waveguide abuts when being inserted, a significant improvement may be achieved in assembly, since the exact, axial position of the optical waveguide no longer need to be observed. This also represents a substantial improvement compared to the MicroMID technology, which does not provide a passive, axial adjustment for the optical waveguide. When inserting the optical waveguide or the plug, excessive adhesive may escape past the optical waveguide or plug. As an alternative, a vent hole or other means suitable from the field of casting technology may be provided, which takes up excessive adhesive that is displaced from the optical waveguide or plug when the optical waveguide or plug is inserted.

The submount and/or the coupling element may be provided with optical reflectors by suitable shaping and coating.

A circuit arrangement used for operating the semiconductor element (e.g., LED and/or a photo detector to be mounted in the same manner) may directly be attached in direct proximity of the semiconductor component on the support, which may for instance be a double-sided printed circuit board. For example, the circuit arrangement may be attached on the back side of the printed circuit board. Thus, for example, a pre-amplifier for a photo diode (PD) may be located only 1 mm away from the PD. EMC problems therefore may be prevented. Since the printed circuit board is typically manufactured in a conventional standard industrial process, the wiring provided thereon may be implemented in any complex manner. High-quality printed circuit boards, such as those made using ceramics or printed circuit boards made of Teflon, particularly necessary for extremely high-frequency applications, may be used.

In order to obtain a complete transceiver system, a coupling element with a flexible printed circuit board may be fit into an electric plug system and the optical waveguide ends may be connected via a splice or plug system. Alternatively, the coupling element with a rigid printed circuit board may be directly inserted into a female plug, wherein the plug contacts are realized (e.g., by contacts on the printed circuit board).

The present inventor has achieved improvements in optical coupling arrangements. Contrary to the known MicroMID process, the optical waveguide of the present invention is not adjusted at the support (e.g., printed circuit board) but at the submount carrying the semiconductor element, this being done directly or by use of the above-mentioned coupling element. If the submount is a metallic or metallized body, it typically does not have the power guidance demanded from a support (e.g., printed circuit board) for both electrical terminal conductors, but only for one of them. On the other hand, by adjusting via a submount, advantages result compared to the MicroMID technology.

As a result of the present invention, a printed circuit board to be newly designed for a given product application does not have to be realized in the expensive MicroMID process having high equipment costs. In addition, the adaptation of the outer electronic connection on a standard printed circuit board requires substantially shorter development times and is less expensive.

By galvanically applying a copper layer having a thickness of 25 to 50 $\mu$m on the MicroMID printed circuit board, the micro-structured plastic surface of the MicroMID substrate substantially loses precision. By comparison, a micro-structured submount according to the invention may have highly precise adjustment structures on its surface and may include a massive or sheet-like metal or metallized plastic element. The invention thus may provide for a significantly higher precision compared to MicroMID.

The structures on the micro-structured submount that can be used for adjusting the optical semiconductor element do not necessarily have to be formed with significant de-formation bevels, since they are not required to be manufactured in a multi imaging process in metal and plastics. Thus, vertical structures are also possible. If a micro-structured submount in the shape of a sheet having thickness of approximately 100 $\mu$m is used, the opening for the semiconductor element can easily be expanded by bending the sheet so that the semiconductor element can be inserted. Subsequently, the fine centering of the semiconductor element may take place during the relief phase.

On a metallic, micro-structured submount, the electro-optical semiconductor element may also be soldered instead of only being adhered as in MicroMID. This leads to a thermally and electrically improved connection between the semiconductor component and the submount, which is particularly important when the semiconductor component is a LED having a bad efficiency, whose lost heat must be dissipated.

In MicroMID technology and in the classic lead frame technology, the entire metal surface of the substrate or of the lead frame may be wire bonded. A surface coating suitable for this purpose is expensive (e.g., palladium support) and particularly has the disadvantage that the optical reflection behavior of the layer is not optimal. A non-bondable silver layer would have a better reflection factor for many applications but it cannot typically be used for the above-mentioned reason. Since, however, it is generally not necessary in the present invention to wire-bond on the submount, this submount can be provided with an ideally reflecting coating, which does not have to take bondability into consideration.

If the substrate of the semiconductor element is non-conductive, so that a direct electrical contacting of the same at the submount is not possible, an electrical connection between the semiconductor component and the support may be implemented, while the other electrical connection between the semiconductor component and the support may be implemented directly on the support by means of wire bonding.

In additional embodiments of the invention, a number of variants are possible and sensible, and may have an advantageous effect independent of the required precision and/or independent of the irradiation properties of the transmitting diode.

The following non-limiting examples illustrate variations for a coupling arrangement according to the invention. For example, a waveguide layer may be formed of a planar plate and a curved plate, a waveguide layer may be formed as a tube, a plurality of semiconductor elements may be optically coupled to the waveguide layer, semiconductor elements may be transmission diodes of different light emission wavelengths, a semiconductor element may be electrically connected to the submount by a use of die bonding, a beam-forming metallic reflector may be formed to surround the optical path and may be arranged between the semiconductor element and the end face of the optical waveguide, the reflector may be formed as a metal layer on the surfaces of the submount surrounding the semiconductor element, the reflector may be formed as a metal layer on a wall of the coupling element between the end face of the optical waveguide and an end portion of the coupling element adjoining the semiconductor element, at least one recess for accommodating a bond wire connecting the semiconductor element with a circuit may be formed in the coupling element, at lest one recess for receiving a bond wire connecting the semiconductor element with a circuit may be formed on the submount, the reflector may be formed to deflect the optical path between the semiconductor element and the end face of the optical waveguide by 90°, the submount (1) may be a lathe work, the submount may be a punched member, the coupling element may be a deep drawn member made of a soft metal, the optical waveguide may be a glass fiber having its end portion adjoining the semiconductor element held by a highly precise ferrule, the ferrule may be adapted to be inserted into the coupling element, the ferrule may form the coupling element and an end of the ferrule may be received by a recess formed in the submount, and an electro-optical transmission converter and an opto-electrical receiver converter may be attached on the submount so that they are shielded from each other and so that the converters optically oppose the same optical waveguide.

Many variations may likewise be used in forming a coupling arrangement according to the present invention. Some non-limiting examples of methods that may be used in forming the coupling arrangement include: manufacturing the submount by a micro-structuring method that includes applying a thin conductive coating on the surface of a micro-structured plastic body, removing projecting sections from this coating by surface polishing, applying metal on the remaining conductive coated surfaces by use of galvanization, and removing this metal structure from the plastic body; a method of manufacturing a coupling arrangement, for optically coupling an end of an optical waveguide with at least one electro-optical or opto-electrical semiconductor element that optically opposes the end face of the optical waveguide, may include the steps of (1) using a two-piece tool to form a cavity that images the coupling element receiving the end portion of the optical fiber, the tool having one part formed as a negative image (e.g., impression) of a submount receiving the semiconductor converter, (2) forming a molded body by injecting a plastic material into the cavity, the molded body being shaped later, (3) metallizing an entire surface of the molded body on its side negatively imaging the submount, (4) removing the metallization by brushing on all projecting portions; (5) increasing the remaining metallization by galvanic metal deposition, (6) separating the metal structure formed on the molded body from the molded body, (7) providing the resulting molded body with a light inlet opening on the bottom of a recess that is determined for receiving the optical waveguide, and setting the molded body onto the submount formed as a coupling element receiving an optical waveguide; a method as just described for forming a coupling arrangement, the method including removing ridges from the metal structure after the galvanizing, and optionally including metallizing the recess, determined for receiving the optical waveguide, in its area adjoining the bottom; a method, for optically coupling a fiber optical waveguide with an electro-optical or opto-electrical semiconductor component mounted on a submount, may include aligning the submount with a coupling element having a bore aligned onto the semiconductor component, filling the space above the semiconductor component and above part of the bore with a transparent adhesive, then inserting the fiber optical waveguide into the bore and curing the adhesive in contact with the end face of the fiber optical waveguide; and, a method of optically coupling the end of a fiber optical waveguide to an electro-optical or opto-electrical semiconductor component mounted on a submount, at which a coupling element is aligned, the method including aligning a bore of the coupling element with the semiconductor component, filling a space above the semiconductor component and part of the bore with a transparent adhesive, then inserting a plug of a non-adhesive material into the bore and curing the adhesive in contact with the end face of the plug, removing the plug from the bore, and then inserting the end of the fiber optical waveguide into the bore.

Any reference herein to a LED or transmission diode as being a semiconductor element shall not be understood in a restrictive way but only as an example, since the present invention may also be used in a same or similar manner in connection with light-receiving semiconductors such as photo diodes, photo transistors or photo resistors.

The foregoing summary is non-limiting. The scope of the present invention is defined only by the appended claims. A preferred embodiment of the present invention will now be described in detail with reference to the drawing figures.

BRIEF DESCRIPTION OF THE DRAWING FIGURES

FIGS. 1A and 1B respectively show in a longitudinal section and in top plan view a structure with a parabolic mirror in the coupling element in a first exemplary embodiment of the present invention.

FIGS. 2A and 2B respectively show in a longitudinal section and in top plan view a submount with a parabolic mirror and a milled slot for receiving a bond wire in a second exemplary embodiment of the present invention.

FIGS. 3A and 3B respectively show in a longitudinal section and in top plan view a submount with a parabolic mirror and a bore for receiving a bond wire as an exemplary alternative to the second exemplary embodiment shown in FIGS. 2A and 2B.

Figure 6A:
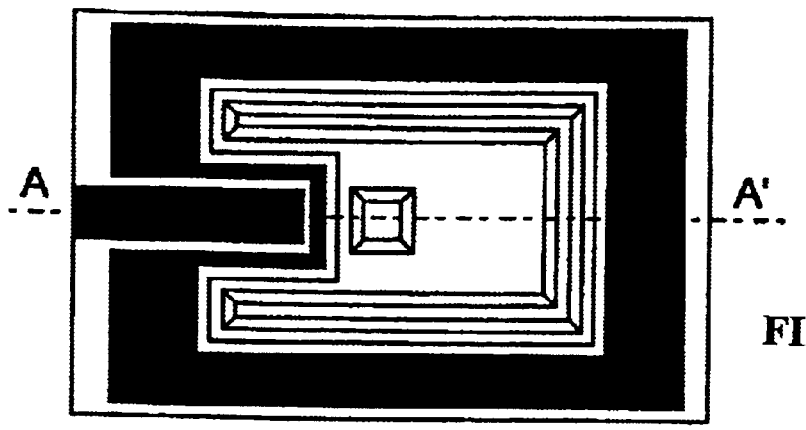
Figure 6B:
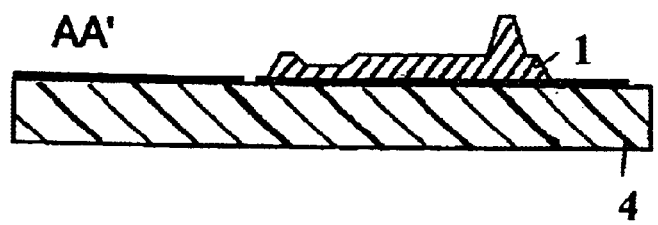
Figure 6C:
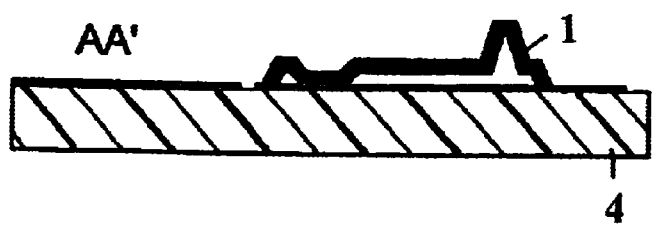
Figure 6D:
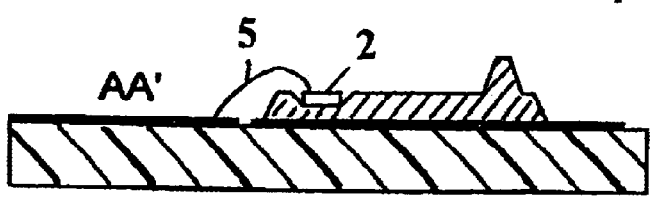
Figure 6E:
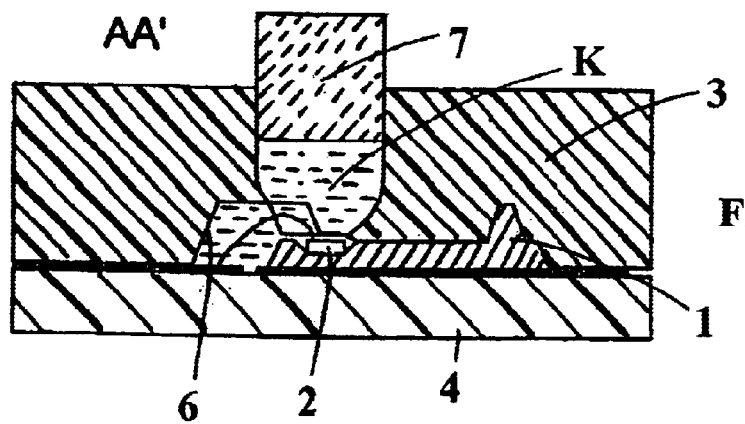

FIGS. 6A–6C respectively show in a top plan view and in longitudinal sections a submount formed in micro structure technology in different assembly steps;

FIG. 6D shows in a longitudinal section the arrangement according to FIG. 6C, and FIG. 6E shows a coupling element adapted thereto, in a fourth exemplary embodiment of the present invention.

FIGS. 7A–7E show an injection molding tool and different stages in the manufacturing process of a submount formed in micro structure, according to the fourth exemplary embodiment of the present invention.

Figure 8:
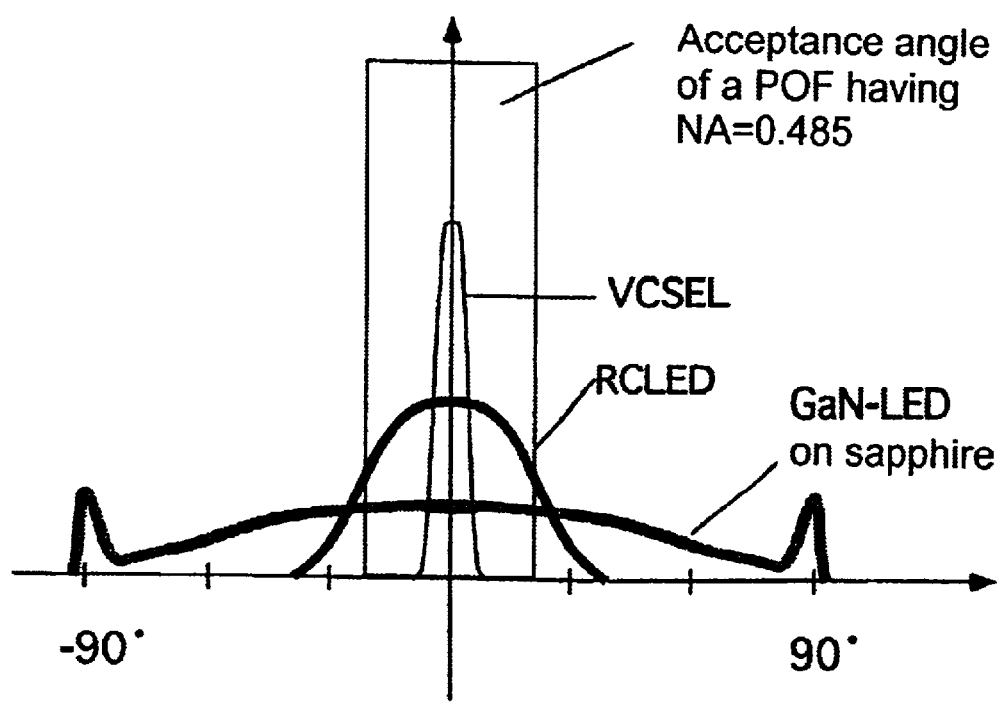

FIG. 8 shows the irradiation diagrams of different types of light-emitting semiconductors.

Figure 9A:
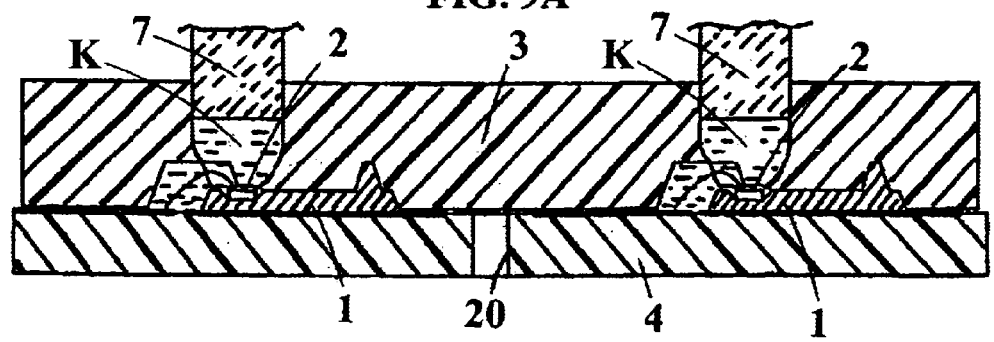
Figure 9B:
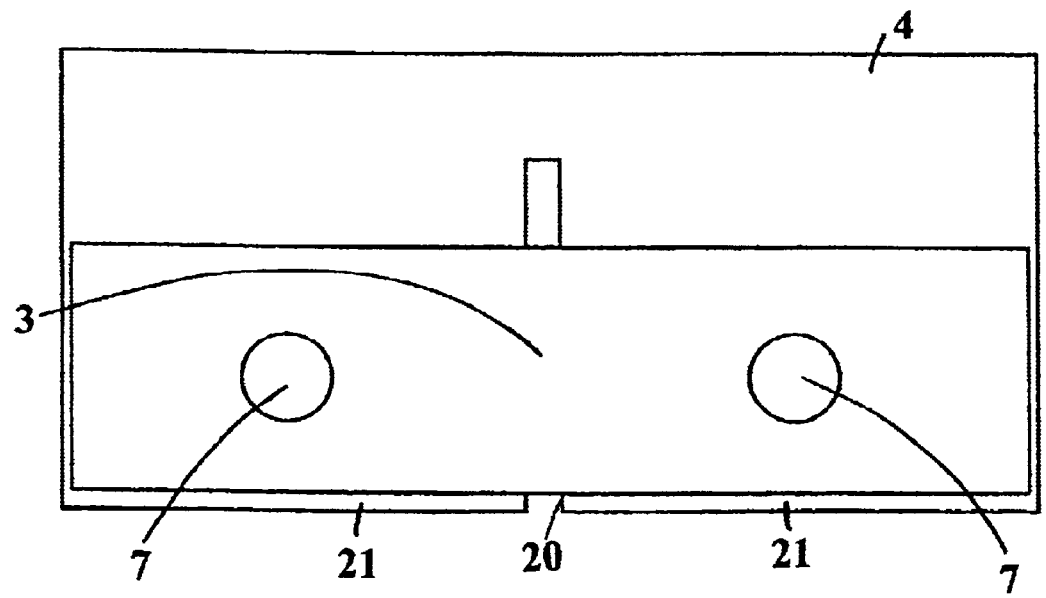

FIGS. 9A and 9B respectively show in a longitudinal section and in top plan view a printed circuit board with several submounts and a common coupling element including the features of the fourth exemplary embodiment of the present invention.

Figure 10:
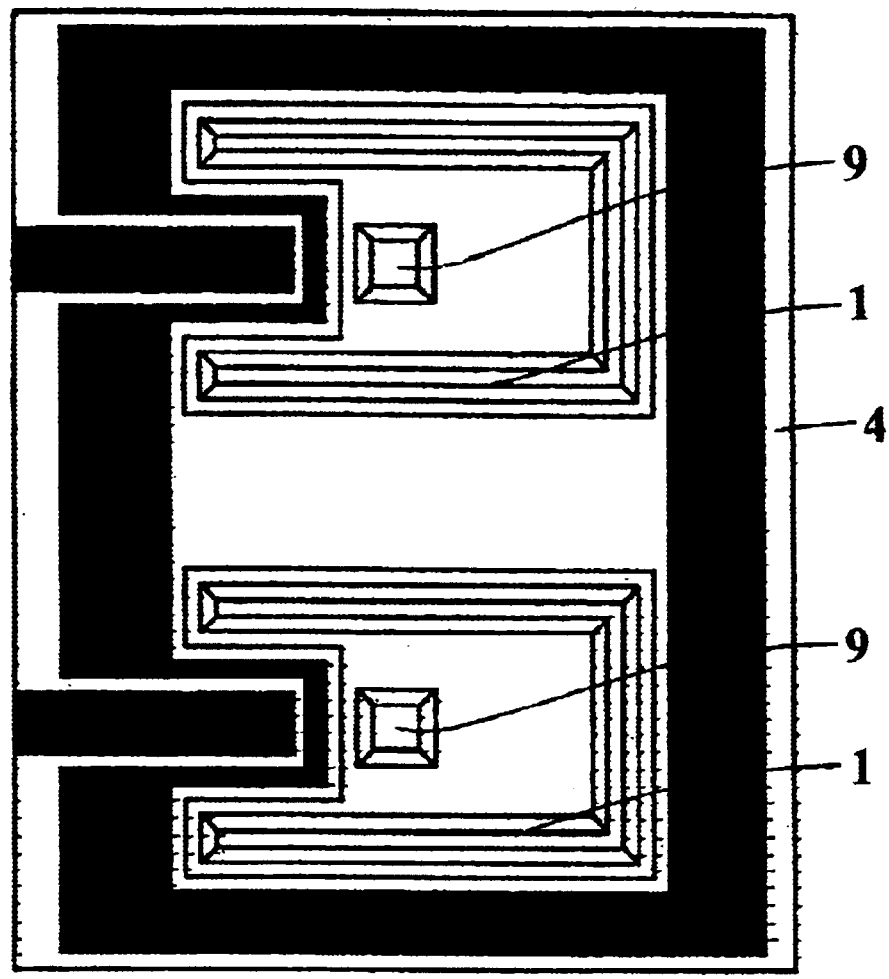

FIG. 10 shows in top plan view a submount formed in micro structure technology for two optical semiconductor chips according to FIGS. 9A and 9B.

Figure 11:
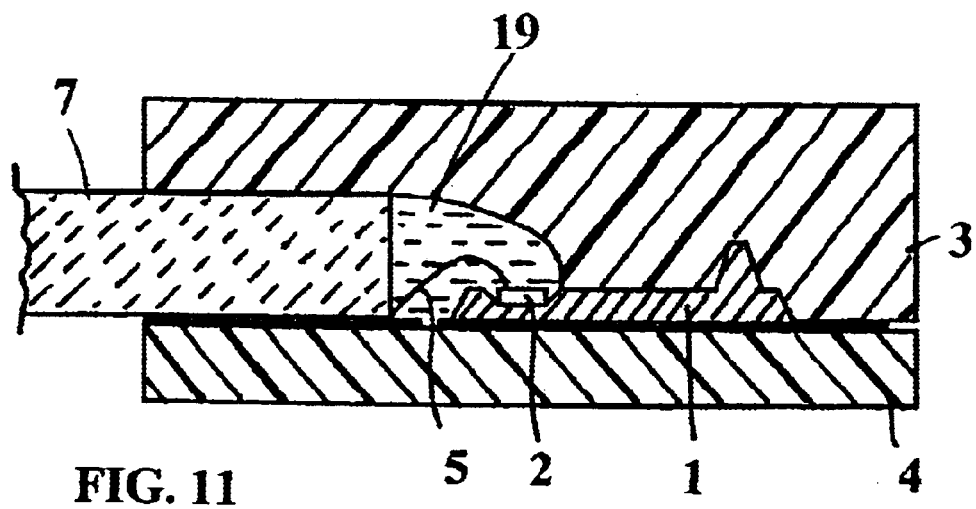

FIG. 11 shows a coupling element with a deflection mirror on a micro-structured submount.

Figure 12:
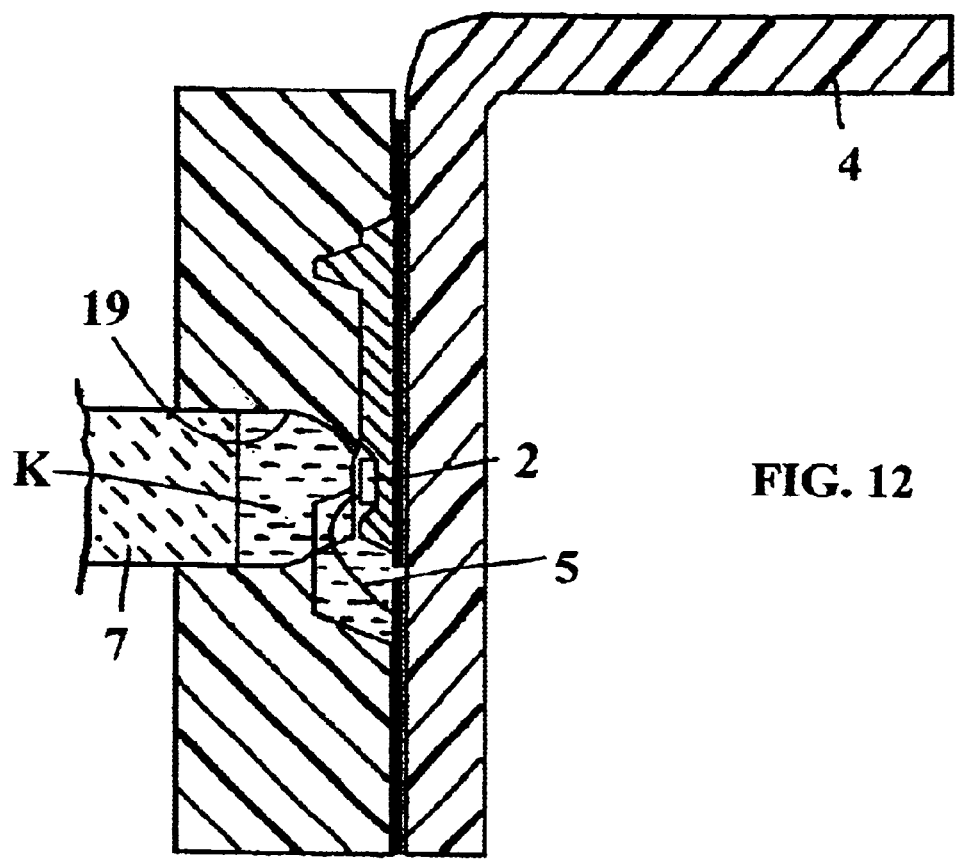

FIG. 12 shows a coupling element with a 90° deflection obtained by use of a flexible printed circuit board.

Figure 13:
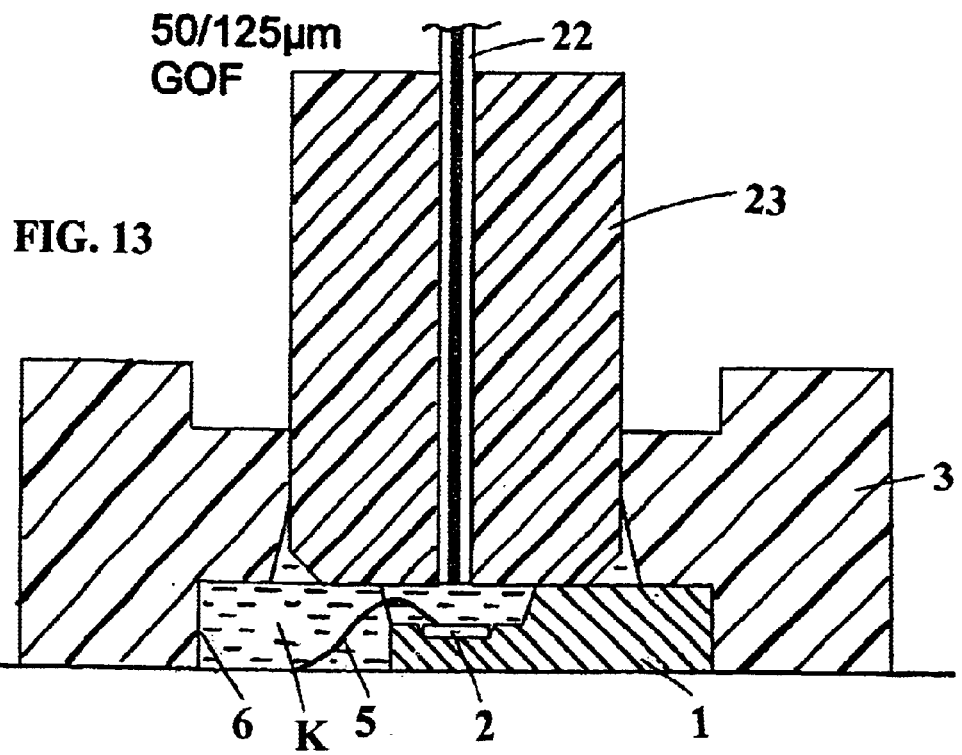

FIG. 13 shows a glass fiber adjustment obtained by use of a highly precise ferrule in a fifth exemplary embodiment of the present invention.

Figure 14:
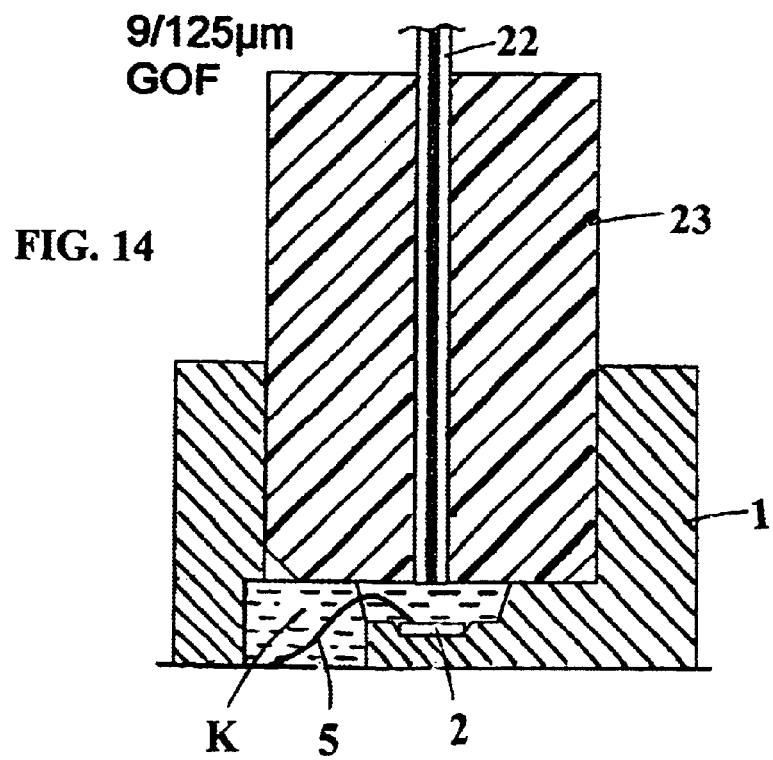

FIG. 14 shows a ferrule receiving a glass fiber and forming the coupling element itself in a sixth exemplary embodiment of the present invntion.

Figure 15A:
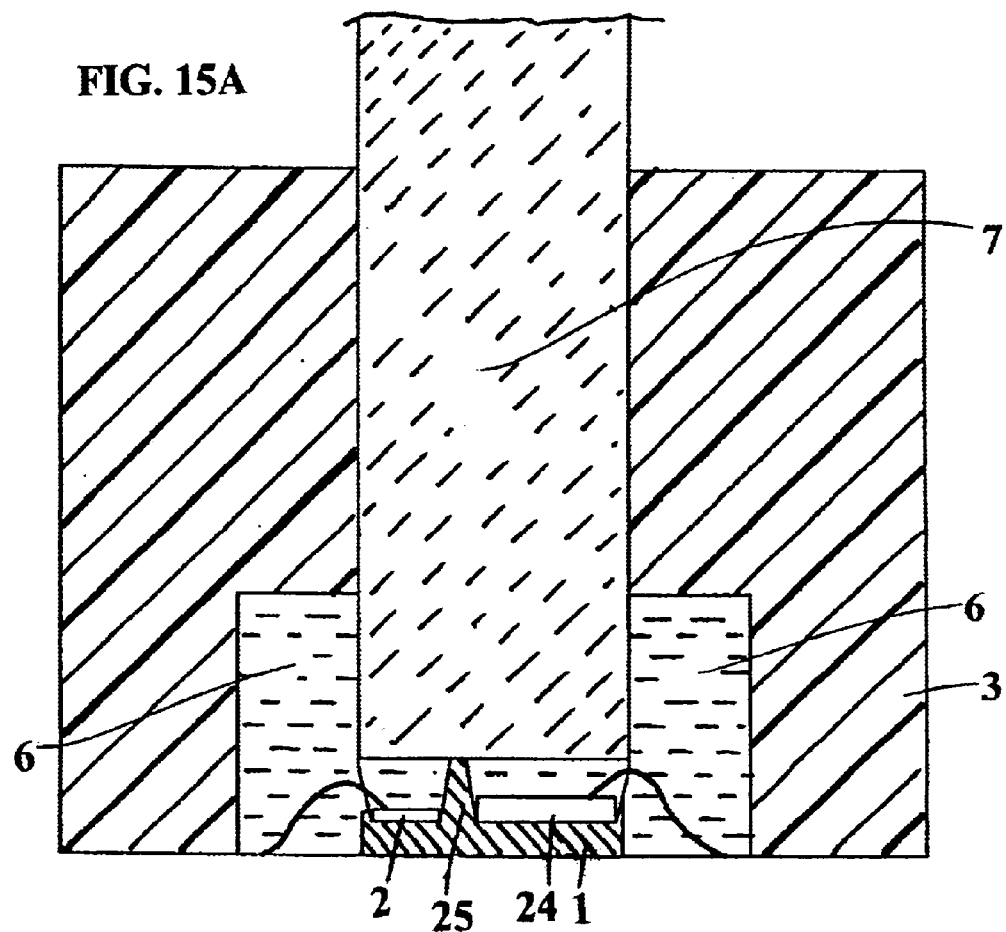
Figure 15B:
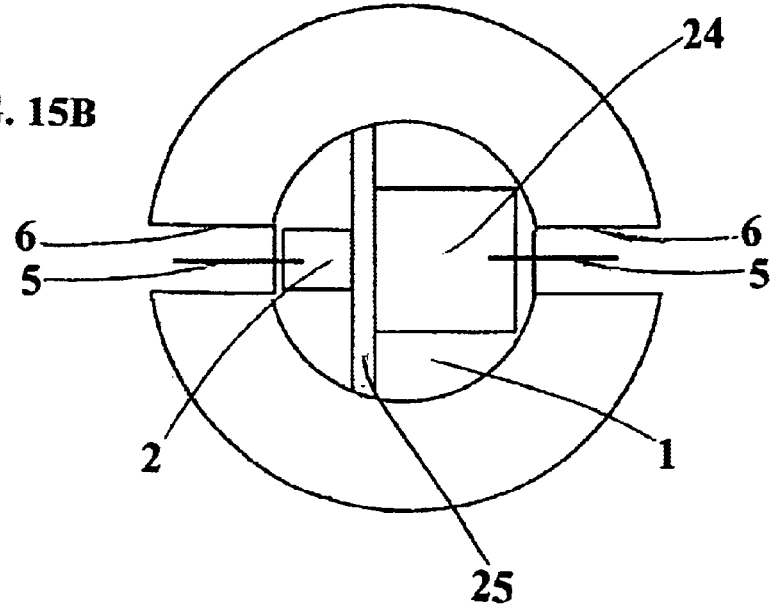

FIGS. 15A and 15B respectively show in longitudinal section and in top plan view a submount that carries a transmission and receiving diode with a common optical waveguide, according to a seventh exemplary embodiment of the present invention.

Figure 16:
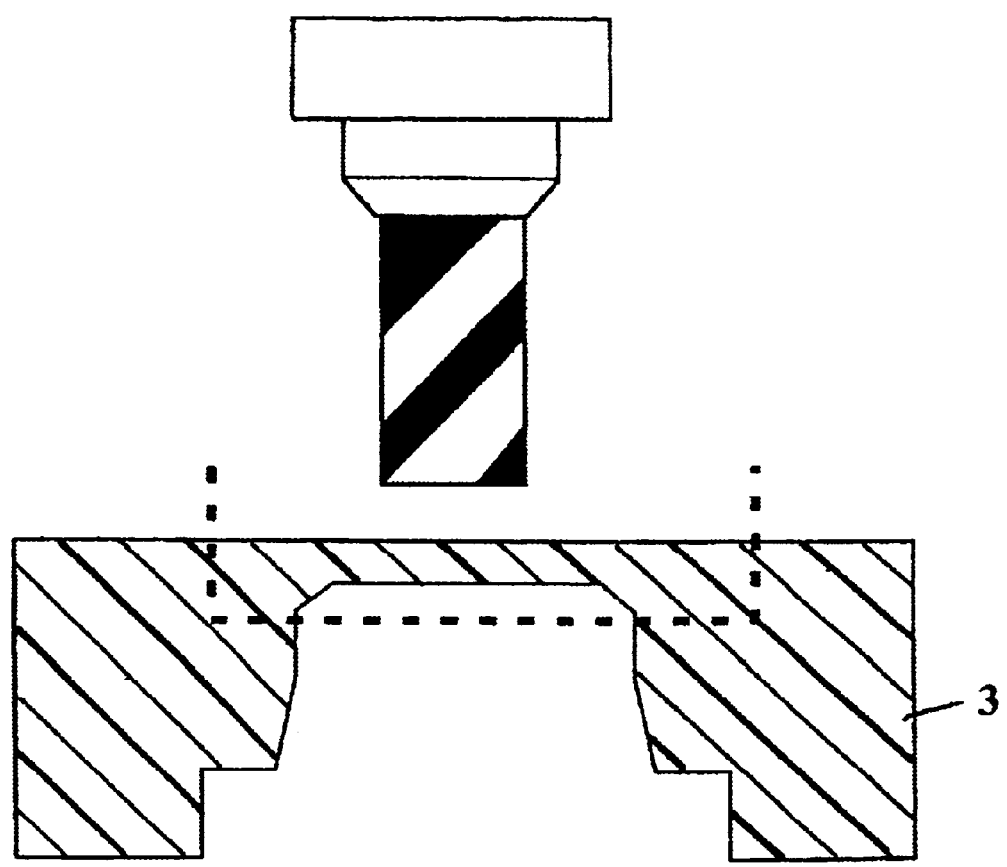

FIG. 16 schematically shows in longitudinal section the manufacture of a fit of coupling element and fiber support complying with high precision demands.

Figure 17:
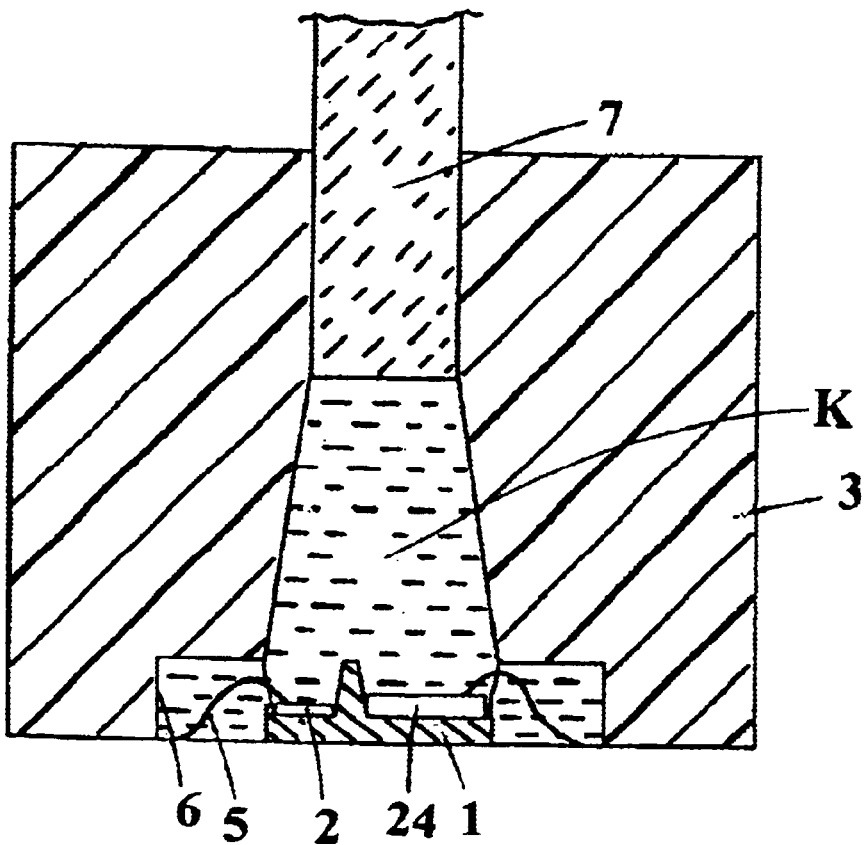

FIG. 17 shows a construction similar to FIG. 15a with a coupling element made of a transparent plastic material.

Figure 18:
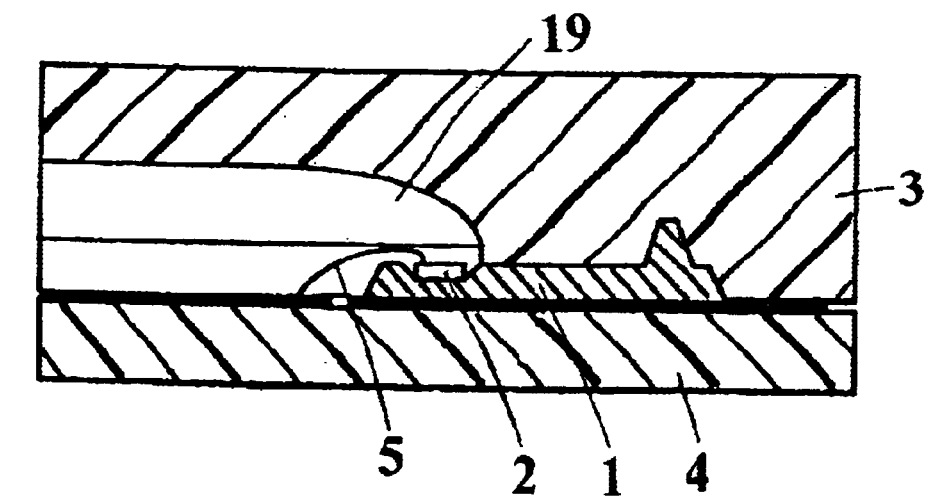

FIG. 18 shows a construction with 90° deflection and a coupling element made of a transparent plastic material, in an eighth exemplary embodiment of the present invention.

FIG. 19 shows a submount fixed on a support by use of a pin, with a coupling element formed as a parabolic mirror, in a ninth exemplary embodiment of the present invention.

FIG. 20 shows a submount fixed on a support by use of a pin and formed integrally with a parabolic mirror aligning an optical waveguide, according to a tenth exemplary embodiment of the present invention.

FIG. 21 shows a top plan view onto a lead frame that is suitable for supporting the submount of the ninth and tenth embodiments.

Figure 22:
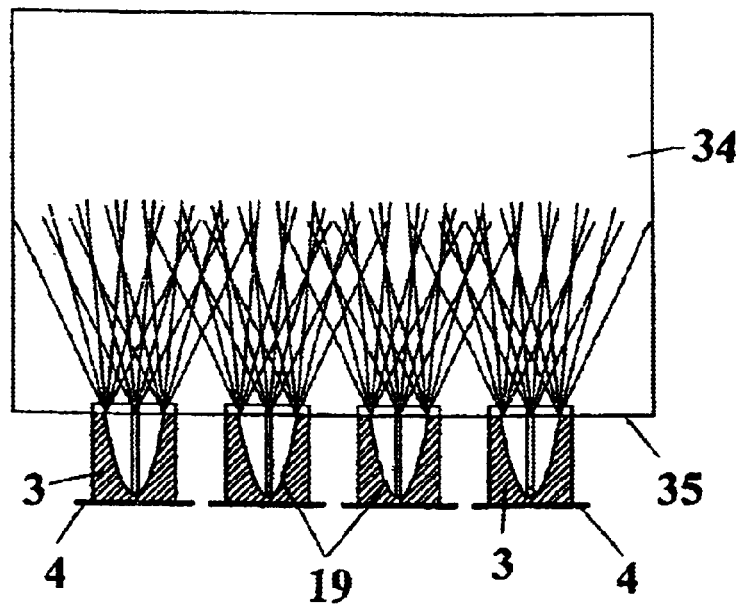

FIG. 22 shows a diagrammatic view of an exemplary embodiment of the present invention with a layered, planar optical waveguide.

Figure 23:
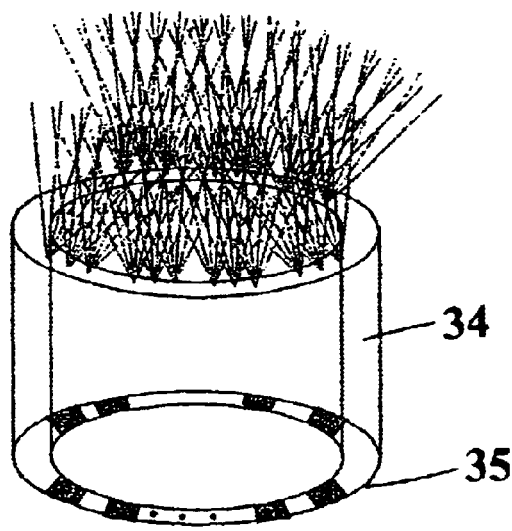

FIG. 23 shows a diagrammatic view of an exemplary embodiment of the present invention with a layered, tubular optical waveguide.

DETAILED DESCRIPTION

Figure 1A:
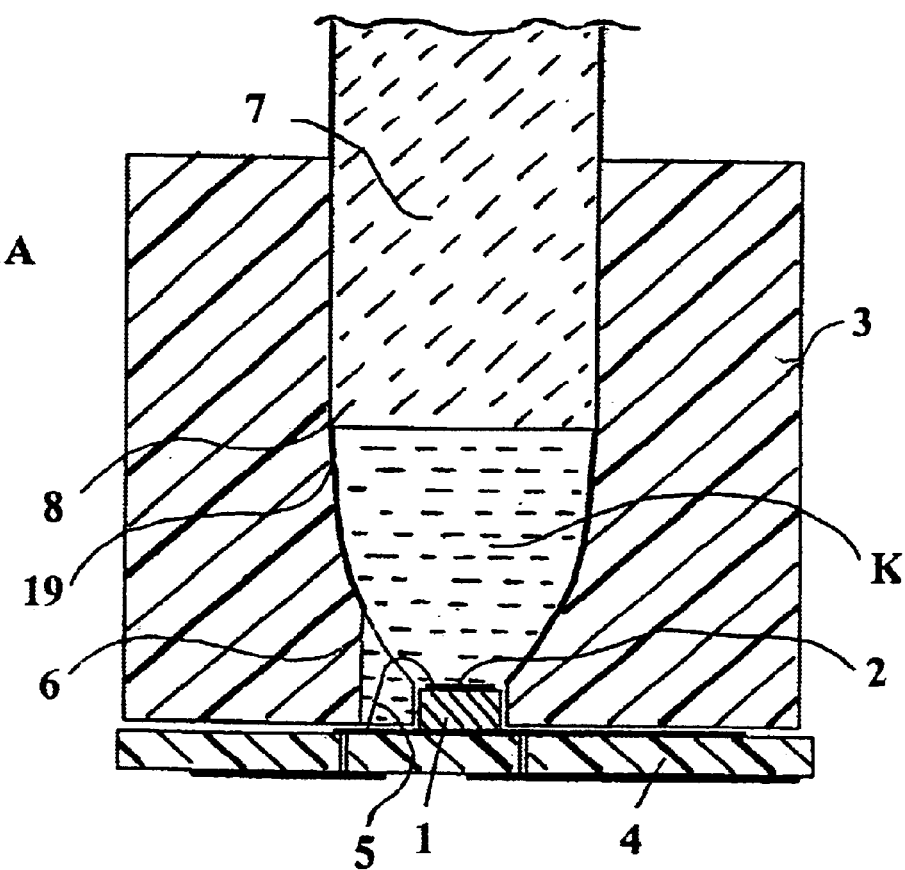
Figure 1B:
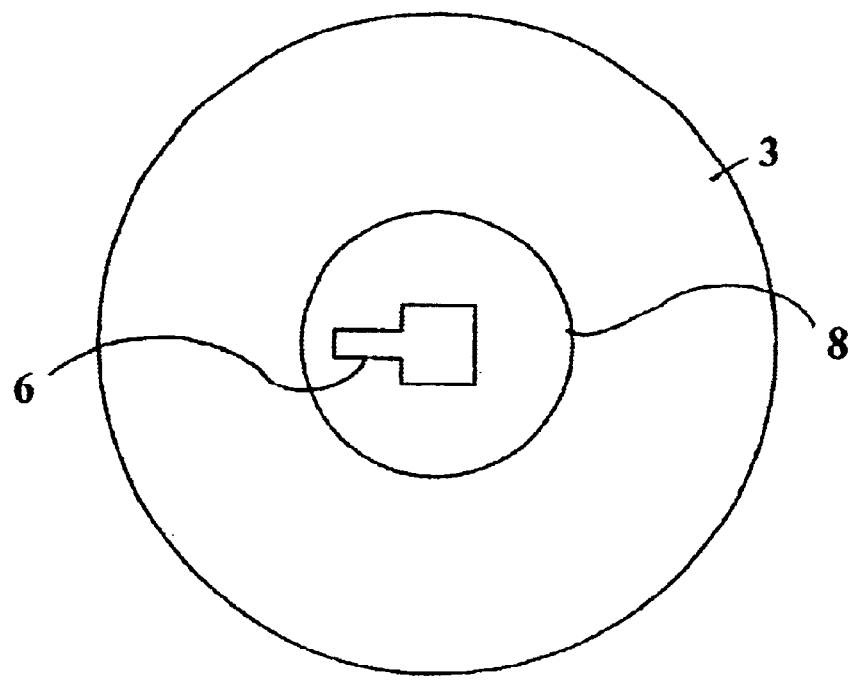

FIGS. 1A and 1B show an arrangement consisting of a submount 1, a light emitting diode (hereinafter referred to as LED) 2 attached thereon, and a coupling element 3, preferably made of plastics, adjusted at the submount 1. In the present example the submount consists of metal and is attached on a printed circuit board 4, preferably it is soldered on, and it electrically connects the one electrode of the LED to the electrical circuit comprised on the printed circuit board 4. The other electrode of the LED is electrically connected to the circuit on the printed circuit board by means of a bond wire 5. The bond wire 5 is received by a slot 6 in the section of the coupling element 3 surrounding the submount 1 and is thereby protected against damage.

A bore is formed in the coupling element 3, said bore receiving an optical waveguide 7, which in this example is an optical fiber. The bore has an annular shoulder 8 at a distance above its lower end at which the end face of the optical waveguide 7 is supported. Below this shoulder 8, the bore is formed to be parabolic and has a metal coating 19 to reflect the light rays, emitted by the LED and impinging onto the bore wall, into the optical waveguide 7.

As may be seen, the bore has a cross section in the coupling element 3 at its lower end, which is matched to the cross section of the submount 1 so that the coupling element 3 is centered at the submount 1.

The space between the end face of the optical waveguide 7 and the LED 2 as well as the slot 6 are filled by a transparent adhesive K, which reaches up to the end of the optical waveguide and which improves the optical coupling between the LED 2 and the optical waveguide 7. It is evident that when filling in the adhesive K, the slot 6 and the bore of the submount must be closed at the bottom, this being, for example, ensured by the support 4, not shown in FIG. 4 or FIG. 5.

As an alternative to the exemplary embodiment of FIG. 1, a plug (not shown) made of a non-adhesive material (e.g., POM, PTFE or a chrome-plated metal pin) may be inserted instead of the optical waveguide 7 into the bore of the coupling element 3 during the manufacture of the arrangement after filling in the transparent adhesive K, the pin then being pulled out of the bore after curing the adhesive K. The optical waveguide 7 can subsequently be plugged into the hole that was formed in this manner and it can optionally also be removed therefrom again.

Figure 2B:
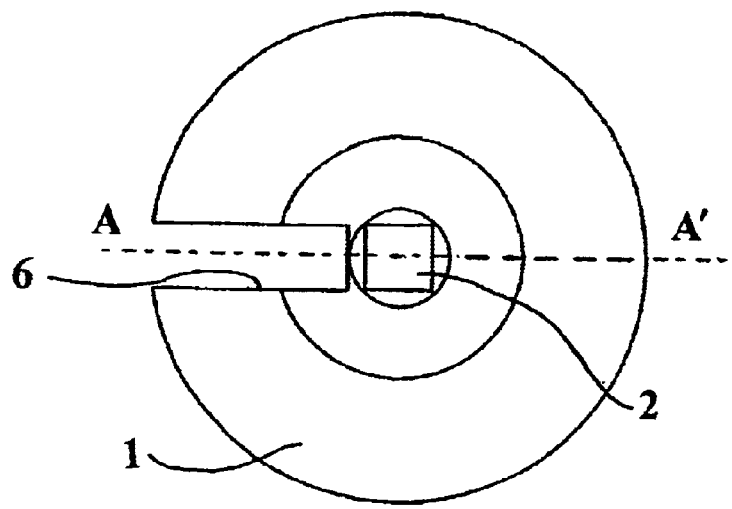
Figure 2A:
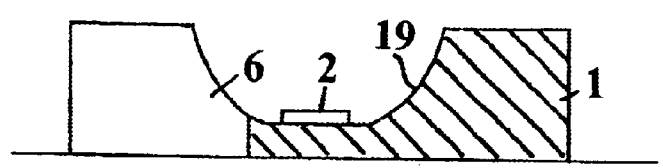
Figure 3B:
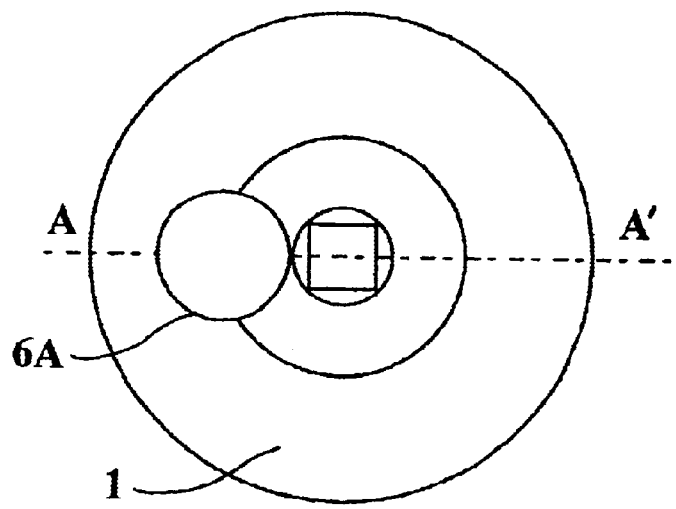
Figure 3A:
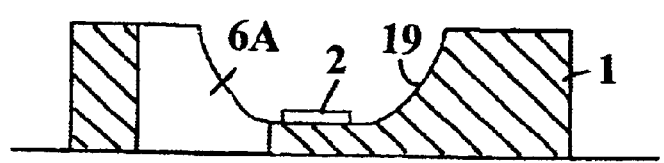
Figure 4:
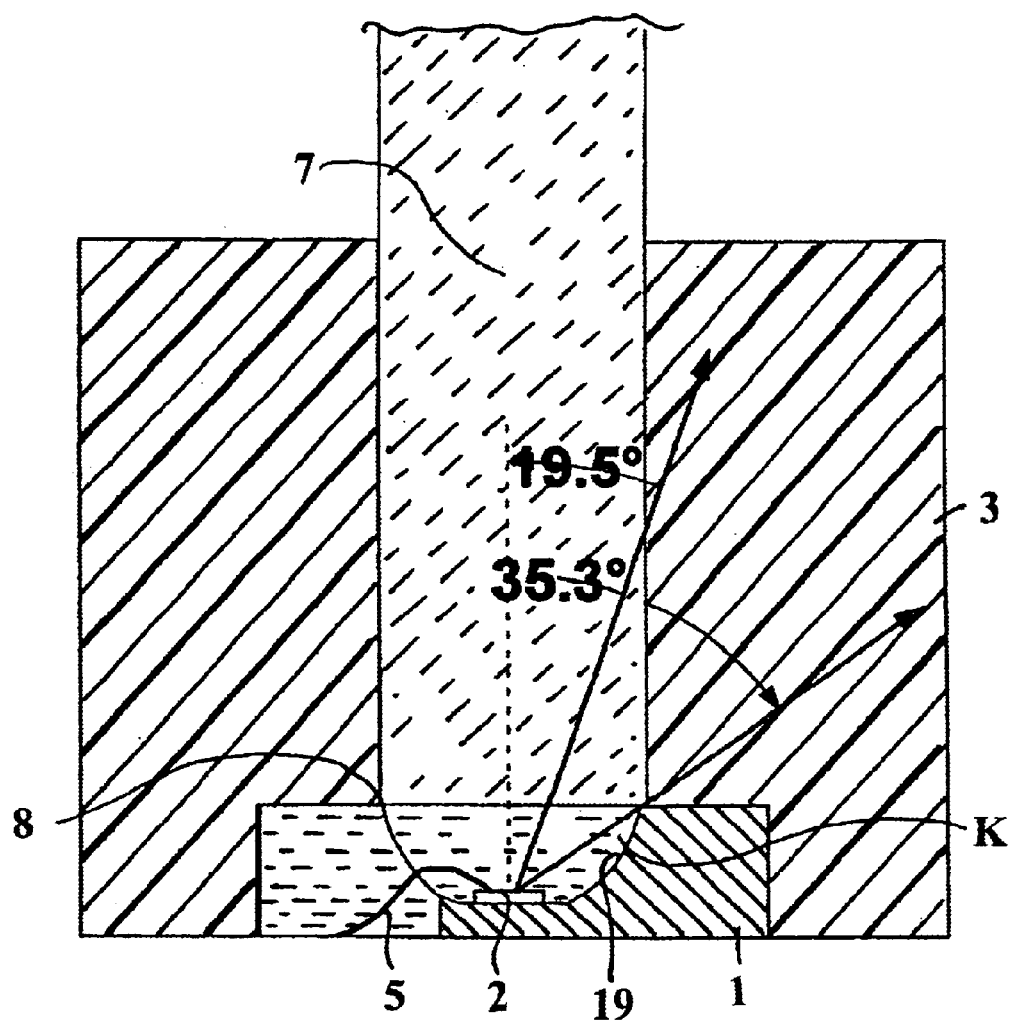
FIG. 4 shows in a longitudinal section the second exemplary embodiment according to FIGS. 2A and 2B with a submount with a coupling element adjusted thereon.

FIGS. 2–4 show exemplary embodiments having a submount with a reflector (e.g., metal coating 19) as a lathe work with a slot 6 (FIG. 2) or bore (FIG. 3) for receiving a bond wire. A detailed explanation is not necessary, since the drawings speak for themselves.

FIG. 4 shows how the coupling element 3 is attached to a submount 1 (e.g., according to exemplary embodiments shown in FIGS. 2A–B and FIGS. 3A–B), and how the optical waveguide 7 is adjusted. The fiber stop can be recognized as a small annular shoulder 8 on the submount 1, since the upper edge of the reflector 19 formed thereon has a slightly smaller diameter than the optical waveguide 7 accommodated by the coupling element 3. The end face of the optical waveguide therefore sits on this shoulder 8 for axially adjusting the fiber.

For certain applications (e.g., in the automotive industry) submounts produced by turning on a lathe may not be sufficiently inexpensive, so that it will be desired to manufacture the member shown in FIGS. 2A–4 by punching or deep drawing. In these processes, the submount 1 may be formed during one working step from a planar sheet in a manner that it obtains the required surface, and at the same time the opening for the bond wire may be punched out.

Figure 5:
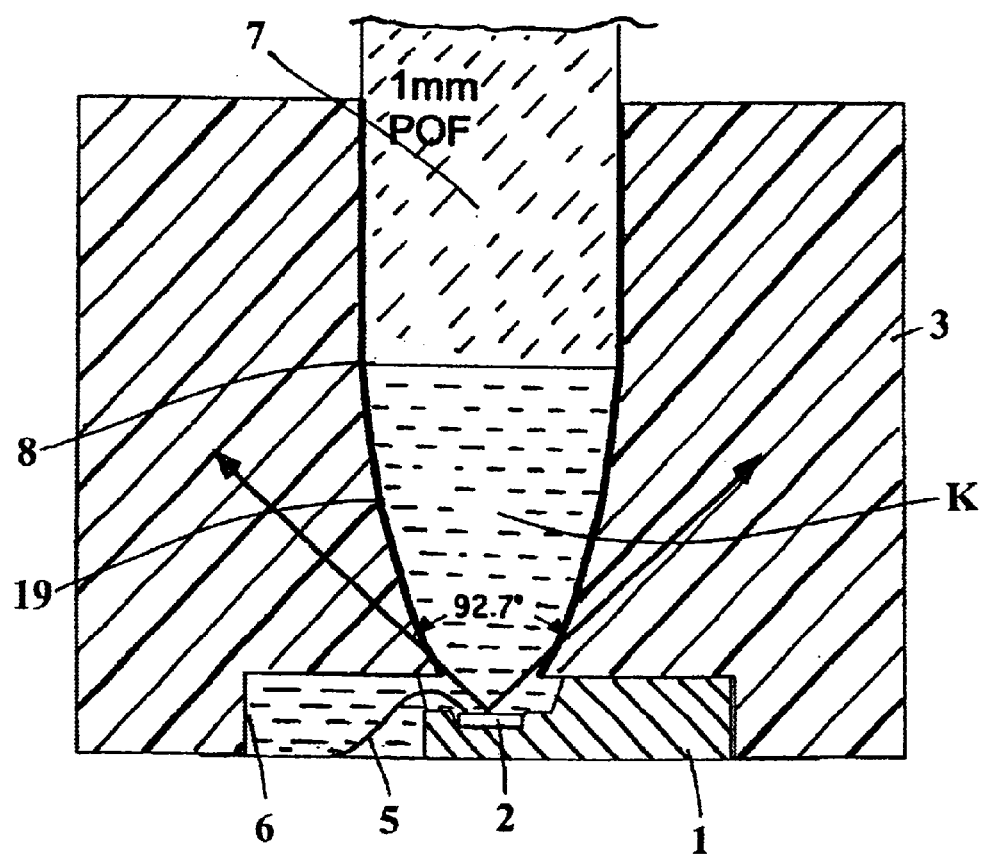
FIG. 5 shows in a longitudinal section a submount without a reflector and a coupling element with a reflector adjusted at the submount, in a third exemplary embodiment of the present invention.

As an alternative, the reflector 19 may be formed in the coupling element 3 (e.g., FIG. 1 and FIG. 5), which is particularly advantageous if the reflector is formed axially with a length so long that it can no longer be formed within the submount in a technically sensible manner. Long reflectors, as shown by example in FIG. 5, are advantageous when using transmission diodes that are irradiating axially closely, such as RCLEDs.

By forming a recess (e.g., round, formed angularly, etc.) on the substrate at a position where the LED shall be positioned, it is possible to provide a passive adjustment device for the semiconductor chip.

In addition it must be noted that punching and deep drawing techniques are manufacturing methods most suitable for the mass production (scale of 1 million and more) for submounts, but the required precision must be ensured. Due to the opening in the submount required for the bond wire, two processing steps are used, which may possibly also be carried out simultaneously, namely shaping of the starting sheet or starting wire (in the case of deep drawing, it is advantageously operated with wire material as semi-finished product, as this does not lead to loss of material) to provide the reflector or the chip adjustment and the adjustment structure for the coupling element, and punching out the hole or slot for the bond wire passing. As an alternative, the hole or the slot may be manufactured by laser cutting. A material suitable for punched submounts may, for example, either be bronze with a high copper proportion (easily deformable, favorable heat conduction) or, in a use analogous to vehicular headlamps, a very pure aluminum alloy (99% Al), which can also easily be deformed, but also silver. A submount made of bronze must galvanically be coated before or after the punching process to obtain a highly gloss finished surface. A submount made of aluminum is subsequently electro-polished which, however, is usually only feasible in the case of very pure grades of aluminum.

The submounts shown in FIGS. 1 to 5 may also be manufactured of a plastic material by thermoplastic molding if this plastic body is subsequently prepared by a metallic coating process in a manner such that the lost heat of the transmission diode can be dissipated and that, if the submount shall contain a reflector, the metal surface is sufficiently reflecting. A coating with approximately 30 $\mu$m copper and a subsequent thin silver deposition usually fulfills this requirement. An advantage of this structure is the simple and still highly precise design possibility of the plastic submount.

It is also possible to make the submount of a microstructured ceramic material, since this material can principally be injection molded.

It is also possible to provide the submount and/or the coupling element with reflectors.

A special advantage of the invention is that the bond wire from the transmission diode to the printed circuit board can be kept extremely short. For frequencies of around 100 MHz, a bond wire with a length of 1 mm is still uncritical. Higher frequencies of more than 1 GHz, as they typically occur in glass fiber lines, require shorter bond wires. The configuration shown in FIGS. 1 to 5 as well as solutions with punched or deep drawn submounts, however, may not meet with the demands on precision for applications in this frequency range. For these applications it is required to manufacture the submounts by use of methods of micro structure technology, which will now be explained with reference to FIGS. 6A–E.

FIG. 6A shows in a top plan view a possible structure for a micro-structured submount 1. It may be formed of a U-shaped, flat object made of metal. Between the two long legs of the U, as close to the edge as possible, a recess 9 is located, in which the semiconductor element 2, in the present case an LED, can precisely be accommodated. The micro-structured submount 1 according to FIGS. 6B–C may be adhered or soldered onto the printed circuit board 4 in a manner such that later a bond wire 5 from the LED 2 can be bonded onto the contact 10 of the printed circuit board 4, this contact being located between the long legs of the U (FIG. 6D).

Depending on the manufacturing method for the micro-structured submount, this submount may also be formed of a massive metal member (FIG. 6B) or of a sheet having a thickness that is constant at any position (FIG. 6C). If such a large amount of metal is galvanically deposited onto a thin metal layer on its lower side so that the recesses existing there are filled, and this side is then leveled by brushing, a structure according to FIG. 6A may be obtained. If, however, a thin layer is galvanically deposited onto the metal layer, the result of FIG. 6C may be obtained.

Since the bond wire 5 is located below the outer, U-shaped elevation, it is protected against damage by lateral influence. If the micro-structured submount 1 is made of a thermally well conductive material, such as copper, it forms an excellent heat sink for the lost heat generated by the diode 2.

FIG. 6E shows how the coupling element 3 can be adjusted at the microstructured submount 1, when the coupling element 3 has on its rear side the surface structure inverse to the micro-structured submount 1. However, the LED 2 in this exemplary embodiment cannot reach into the interior of the reflector in the coupling element 3, since it is surrounded on all sides by the micro-structured submount 1.

A exemplary method of manufacturing the micro-structured submount and the associated coupling element will now be explained with reference to FIGS. 7A–D.

Figure 7A:
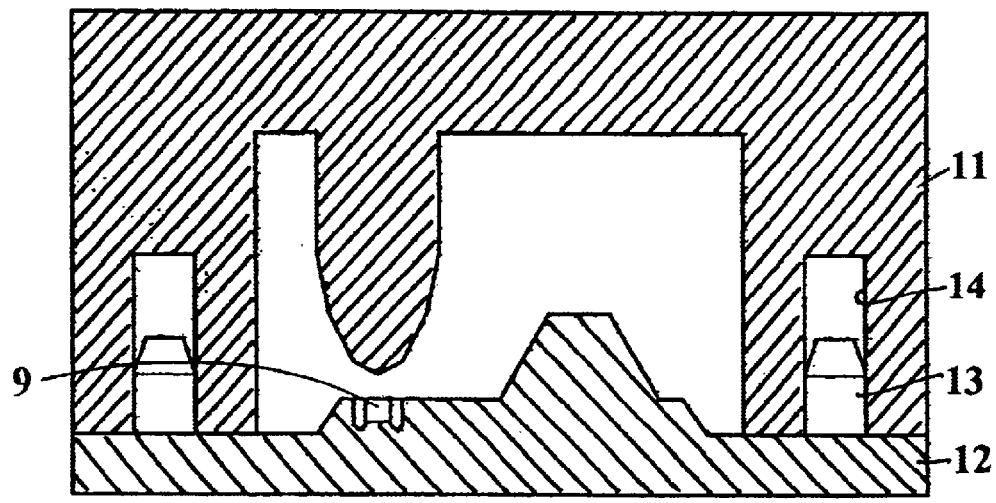

FIG. 7A shows a two-piece injection molding tool for manufacturing the submount and the matching coupling element. The injection molding tool may include an upper part 11 and a lower part 12, which are aligned with respect to each other by use of adjustment pins 13 and adjustment bores 14 and which encompass a cavity.

Except for the recess 9 used for the accommodation of the semiconductor chip, the precision of the surface structure of the tool is uncritical, since any 'error' is automatically integrated into the coupling element and the micro-structured submount. The main difficulty when making the tool is therefore the precise integration of a rectangular recess 9 (e.g., with a typical 250 μm×250 μm surface) into the lower part 12 of the injection molding tool. If for this purpose (e.g., for cost reasons) galvanic technology shall not be used, two more simple methods can alternatively be used, sink erosion with micro dimensions or precision drilling/milling drilling. The latter method is by far the most inexpensive method, if a forming of the vertical walls during the molding process does not lead to difficulties.

Figure 7B:
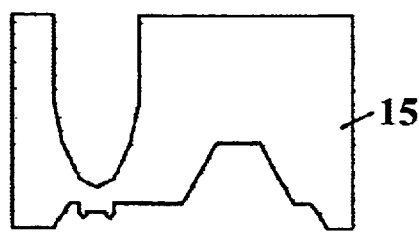

The upper tool member 11 must precisely be adjusted with respect to the lower tool member 12, which can be accomplished by use of the adjust pins 13 and adjust bores 14. Then, the enclosed cavity is spouted by plastics thereby forming a plastic body 15, which may in turn be used as a lost molded core and which is shown in FIG. 7B.

For the manufacture of the submount, the lower side of this plastic body 15 may be used. In providing this additional functionality for the manufacture of the coupling element, both sides of the plastic body 15 are used.

Figure 7C:
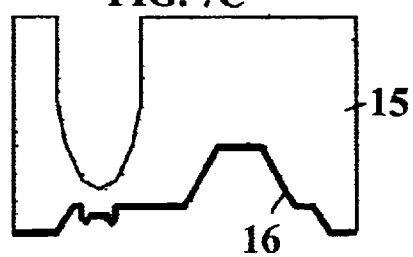
Figure 7D:
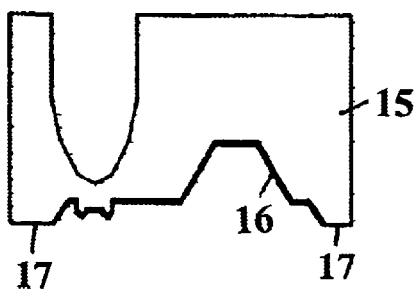
Figure 7E:
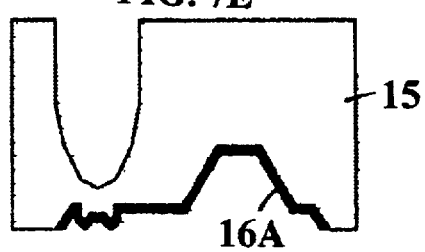

An exemplary embodiment for manufacturing of the submount is now explained. The entire lower side of the plastic body 15 (FIG. 7B), manufactured by use of an injection mold, is provided with a thin, electrically conductive layer 16 formed by sputtering, evaporation, or by use of wet-chemical processes (FIG. 7C). Subsequently, this side is brushed or polished. By this process, the thin metallization is removed on all projecting portions 17 and thus the micro-structure of the later submount is isolated (FIG. 7D). This step allows the precise limitation of the submount at the "bond wire position".

A galvanically or chemically depositable metal is applied in an arbitrary layer sequence onto the remaining metal layer 16. The resultant structure is shown by reference number 16a in FIG. 7E. Aspects considered in the metal selection are thermal conductivity, mechanical stiffness, smoothness of the rear side (leveling), and the ability to be soldered and adhered (moistening). For example, nickel and copper are useful candidates. If the rear side is coated with tin, a soldering process of the submount on a printed circuit board is facilitated.

Depending on the leveling character of the galvanic bath used, metallic bulges may disturb the levelness of the rear side of the later submount. In this case, it is also useful to subject the galvanically structured layers on a plastic body to another grinding process and to thereby remove these ridges. If the quality requirements are not too high, a brush machine can also be used for this purpose.

Subsequently, the metal body formed in this way is separated from the plastic body 15. For this purpose, all plastic-destroying procedures can basically be taken into consideration (e.g., thermal, chemical and with restrictions also mechanical procedures, since the metallic micro-structure may be more easily harmed by such a mechanical process). Preferably, a selective heating of the metallic micro-structures (e.g., by microwave irradiation, high power heating or eddy current heating) beyond the glass transition temperature of the plastic material and a subsequent plastic clearing in a bath of organic solvents, such as an NMP bath can be taken into consideration.

If the metallic micro-structure is to be wire-bondable, it must be coated again especially for this purpose. The micro-structured submount is then ready for being mounted onto a printed circuit board.

Now an exemplary manufacture of the coupling element exactly fitting to this submount will be explained. By use of the mentioned two-piece tool, a plastic body 15 is injection molded, as shown in FIG. 7B. The recess 18 formed therein for receiving the optical waveguide is metallized in a lower, parabolic portion 19, to be able to act as a reflector. A simple method for this purpose involves the use of a reductive silver coating with two-component spraying which is known from the manufacture of mirrors and from the jewelry industry. A subsequently applied transparent lacquer may prevent silver migration. For wavelengths in the more remote infrared, gold coating techniques may be applicable.

Two additional manufacturing steps are employed in order for the coupling element to be serviceable. A hole (e.g., FIG. 1) must be worked into the reflector portion 19. This can be most easily be implemented if the demands on precision are not too high by use of a punching tool, which can precisely be positioned through the recess for the optical waveguide. As an alternative, drilling processes by use of a laser beam are possible.

Before the coupling element 3 can be set onto the micro-structured submount 1, those portions 6 of the plastic body 15 that are occupied by the electronic or electrical elements (e.g., LED, bond wire, circuit etc.) must roughly be removed. This may be implemented in the case of small numbers of pieces by drilling or milling. See in this respect the examples of FIGS. 1–5. In the case of larger numbers of pieces, the tool may be modified accordingly.

The submount and the coupling element, which are manufactured according to the above-mentioned method, fit onto each other with an extremely high precision. Their joining surfaces are perfectly inverse with respect to each other, since they originate from an identical reproducible geometric surface, i.e., the surface of the plastic body shown, for example, in FIG. 7b.

A variety of different transmission diodes exist, wherein each diode emits a characteristic radiation into the steradian, depending on the operating current. FIG. 8 shows three typical steradian spectra, as they occur for VCSEL, RCLED and GaN-LEDs on sapphire substrates. Since the radiation of a VCSEL (Vertical Cavity Surface Emitting Laser diode) is normally fully in the acceptance angular range of a optical waveguide, beam forming measures are superfluous in this case. The coupling element according to the invention is typically used in this case only for the lateral adjustment between the diode and the optical waveguide. The radiation of a RCLED (Resonant Cavity Light Emitting Diode) takes a significantly larger steradian so that beam-forming measures are advantageous also when being coupled to optical waveguide with a high aperture. The RCLED radiation is, however, still basically concentrated to portions that are axially close so that a long parabolic reflector with a great distance from the LED should be used, relevant dimensions being calculated in a manner that allows the light impinging onto the reflector surface to be reflected into the optical waveguide. For an LED with a very broad angular spectrum and a characteristic possibly irradiating directly to the side, a short reflector is the most effective beam-forming measure. Here, the irradiation emerging from the diode chip to a significant extent into the lateral direction can be coupled into the optical waveguide.

If several electro-optical chips (arrays) are coupled on a printed circuit board to an optical waveguide in the manner according to the invention, the following problem may occur. If the submounts 1 are manufactured separately and set onto the printed circuit board for each transmission diode 2, they do not fit to a coupling element 3 that consists of one piece. Two solutions are provided for this occurrence. A first solution is shown by way of example in FIGS. 9A–B. The LEDs 2 and the LED/submount units are bonded onto the printed circuit board 4 prior to the optical waveguide coupling. Mechanical tolerances naturally occur, which cannot be offset in the coupling element 3, which is formed of one piece, for several optical waveguide 7. In order to offset these tolerances, a flexible printed circuit board 4 may be used, which may also have a slot 20 to increase its flexibility. The simply movable tongues 21 of the printed circuit board 4 can easily be moved towards the position provided for them in the coupling element 3.

An alternative solution is shown in FIG. 10. Several receptacles 9 for semiconductor chips are arranged on one single submount 1. This solution can generally only be applied in connection with micro-structured submounts. Since the micro-structured submount 1 can be manufactured at high precision, the distances between the semiconductor chips can be chosen such that the submount 1 can be inserted into the coupling element 3 that is manufactured with the same high precision. A tolerance compensation as in FIG. 9 is not required. To explain FIG. 10, reference is made to the explanation of FIG. 6 in order to avoid repetitions.

Configurations are known from the MicroMID technology, which operate with deflection reflectors for the 90° deflection of the light irradiated by the diode (see, e.g., DE 198 51 265 A1 at FIG. 11). These constructions have the advantage in many practical applications that the optical waveguide and the printed circuit board are on one plane and the housing around the transceiver arrangement can therefore be formed in a flatter way. For example, this is advantageous if the transceiver shall be located in the interior, such as on the inner layer of an electro-optical printed circuit board.

An application of this general idea to structures according to the invention is shown by way of non-limiting example in FIG. 11. Contrary to DE 198 51 265 A1, the adjustment is not carried out by use of the printed circuit board 4, but the adjustment is instead on the submount 1.

The necessity for the 90° deflection between the optical waveguide and the printed circuit board via a deflection mirror 19 is only for limited special cases and some possible applications of the disclosed invention (e.g., electro-optical printed circuit board, coupling to integrated-optical circuit). Since the printed circuit board 4 onto which the submount 1 is set, can be made of a flexible material, the effect of saving overall height (as shown in FIG. 11) can also be achieved according to FIG. 12 by folding a flexible printed circuit board 4. By this construction, the optical waveguide 7 perpendicularly set onto the printed circuit board is also brought on one plane with the printed circuit board 4.

If transceivers are to be manufactured for glass fibers used as an optical waveguide with standard diameters of 125 µm, the manufacture of a coupling element with an axially long highly precise hole of a diameter of only 125 µm will become technically difficult. In that regard, it is offered according to FIG. 13 to hold the glass fiber 22 first of all by a highly precise ferrule 23 (tolerances below 1 µm) and then to adjust the ferrule 23 in the manner according to the invention by use of the coupling element 3 on the submount 1. FIG. 13 shows this arrangement.

Even greater demands on the adjustment accuracy can be fulfilled if the ferrule 23 forms at the same time the coupling element according to the invention. FIG. 14 shows a submount 1, which is formed on its surface in a manner that the ferrule 23 with the glass fiber held therein may directly be inserted and opposes the semiconductor chip in a centered manner.

The construction shown in FIGS. 15A–B enables the extremely inexpensive structure of transmission/receiver modules (transceivers), which at the same time (i.e. not in the time multiplex or duplex operation) enable the data reception and the data transmission. An LED 2 used as a transmitter and a photo diode 24 (PD) used as a receiver are arranged on a common submount 1. Between these two components the submount 1 has a back 25, which optically shields the two components against each other. An optical waveguide common to the two electronic components 2 and 24 is held in a coupling element 3. The submount has two slots 6 for receiving the bond wires 5 leading from the components 2 and 24 to the printed circuit board (not shown). The back 25 at the same time serves for supporting the optical waveguide in the predetermined distance from the components 2 and 24 and therefore takes over the function that is provided by the shoulder 8 in the other embodiments.

It is advantageous compared to the prior art that the diodes 2 and 24 have no electric interaction, since the current of the transmission diode does not have to flow through the chip of the receiver diode.

An exemplary embodiment suitable for high precision demands is shown in FIG. 16 in the longitudinal section, in which the coupling element 3 is provided on the one side first of all with a blind hole, which is later opened mechanically from the rear side (e.g. by milling) whereby the area defined in FIG. 16 by the dotted line is removed on the surface of the coupling element 3. In this manufacturing method, the tolerances are avoided that occur during the injection molding of the upper tool surface and the lower tool surface, since the matching parts are defined from the same side.

If the coupling element consists of a transparent plastic material and if the refractive index of the adhesive filled in is larger than the refractive index of the coupling element, an optical waveguide is produced in the coupling element, such optical waveguide being useable for the cross sectional adaptation between the fiber and the coupling position. In this way, an arbitrary amount of electro-optical chips can be coupled to one single fiber. An example for this is shown in FIG. 17.

A different application results if the transceiver contains an integrated-optical 1×2 splitter for bi-directional operation on one single optical waveguide. By using a deflection reflector, an especially simple coupling from the transmission and receiver diodes to the integrated optical structure is possible. The light of the transmission diode is in this case not coupled into a fiber but into an integrated optical waveguide, as shown in FIG. 18. Here, the coupling element also consists of a transparent plastic material and the adhesive filled in has a higher refractive index than the plastic material of the coupling element.

FIG. 19 shows another exemplary embodiment of the invention, in which the submount 1 is provided with a pin 26 on its side disposed opposite the semiconductor element 2. The submount 1 comprises on its surface a parabolic recess which is provided with a metal coating 19, comparable to the coating for the embodiment of FIG. 4. Moreover, the FIG. 19 structure is provided on its surface with an annular step 27 at which a cylindrical coupling element 3 is centered, which has an axial bore, which is shaped parabolically and which is steplessly connected to the recess in the submount 1. An optical waveguide 7 is set into the upper end of this bore. The gap between its end and its opposing semiconductor element 2 that is attached on the submount is filled by a transparent adhesive K.

The pin 26 of the submount is received by a breakthrough 28 in a first connection flap 29 of a support 4, provided in this case as a lead frame, which is shown in sections in FIG. 21 in top plan view. Pressing hooks 30 integrally formed on the lead frame project into the breakthrough 28, the pressing hooks resiliently contacting the pin 26 when pressing the pin 26 into the recess 28 and the tips thereof digging into the pin 26 so that the pin 26 and thus the entire submount 1 are secured at the lead frame 4. Additionally, the lead frame 4 may be soldered with the connection flap 29 of the lead frame 4, where it is solderable. The lead frame 4 further comprises a second connection flap 31 that is separated from the first one and at which second flap the bond wire 5 is connected.

For mechanically stabilizing the entire arrangement, the lead frame 4 is molded together with the submount 1 and the coupling element 3 in the lower portion of same with a plastic material 32. This plastic material may be the same material that is filled into the bore and the submount 1 as adhesive K, wherein in this case the filling of the adhesive and the molding of the arrangement may be carried out by the aid of a mold in one single process. It is evident that webs 33 connecting the two connection flaps 29 and 31 of the lead frame 4 and all other parts of the lead frame, that are no longer required and that can be seen in FIG. 21, are being removed after molding the arrangement.

An alternative embodiment according to FIG. 20 differs from the embodiment according to FIG. 19 in that the submount and the coupling element are combined to form an integrated unit 3. All remaining features resemble those of FIG. 19 so that a repetition of the explanation is not herein included.

FIG. 22 shows an arrangement of four LEDs, which are coupled in juxtaposition to an edge 35 of a common optical waveguide 7 which, for example, may be a flat, light-conducting plate 34 e.g. made of plastics. The light emitting diodes may be held in arrangements as they are, for example, shown in FIGS. 19 and 20, and their design is shown in FIG. 22 only schematically, i.e., without details. However, it is important that the coupling of a part of coupling elements 3 to the ends of parabolic mirrors 19 remote to the LEDs takes place. For this purpose, the coupling elements 3 may have corresponding cut-outs on their free end face, which receive the edge portion of the plate-shaped optical waveguide 34. The light emitting diodes may have different colors so that the light colors in the optical waveguide 34 additively mix. In this manner the generation of the mixing color white is possible in the case of an appropriate matching of the color temperature and the light intensity of the light emitting diodes.

FIG. 23 shows an arrangement that is comparable to the arrangement of FIG. 22, except that for reasons of clarity the light emitting diodes and their coupling elements are not shown. The important feature compared to the embodiment according to FIG. 22 is that the optical waveguide 34 is formed as a tube at whose edge 35 a plurality of light emitting diodes are coupled, each with a coupling arrangement according to the invention, while the opposing edge serves as a light outlet direction. In this embodiment the light mix colors can also be generated.

It is evident that in the embodiments of FIGS. 22 and 23 all features described with reference to the preceding embodiments are preferably used to an extent possible. This particularly refers to the metal coating of all components participating in the light guidance, the filling of empty spaces with transparent adhesives, the alignment of optical waveguides through positive locking to the coupling elements and the attachment of the semiconductor components by means of submounts on their respective supports as well as the formation thereof.

The invention has been described in detail for purposes of understanding. The structure and capabilities of the present invention may be modified, however, to meet the demands of the particular application. Hence, reference herein to specific details of the illustrated embodiments is by way of example and not by way of limitation. It will be apparent to those skilled in the art that many additions, deletions and modifications to the illustrated embodiments of the invention may be made without departing from the spirit and scope of the invention as defined by the following claims.

What is claimed is:

1. A coupling arrangement, comprising:
   a waveguide having an end portion including an end face;
   a support having at least one conductor formed thereon;
   at least one semiconductor element, the semiconductor element being one of an electro-optical type and an opto-electrical type, the semiconductor element being disposed to optically oppose the end face of the waveguide, the semiconductor element being fixedly connected to the support;

a bond wire electrically connecting the semiconductor element to the conductor;

a coupling element connected to the support and adapted to receive the end portion of the waveguide;

a submount having a top and bottom side, the submount being fixed at its bottom side to the support, the submount having on its top side an adjustment structure in the form of a recess adapted for precise adjustment of the semiconductor element; and a transparent adhesive, wherein
the semiconductor element is fixed in a thermally conductive manner to the submount, the coupling element is positively aligned on the submount, at least that conductor of the support onto which the bond wire is connected is electrically isolated from the submount, and wherein a space between the semiconductor element and the end face of the waveguide is filled by the transparent adhesive.

2. A coupling arrangement as claimed in claim 1, adapted so that the end portion of the waveguide is able to be inserted into the recess of the submount without tolerance.

3. A coupling arrangement as claimed in claim 1, wherein an optical path is defined for the semiconductor element, the coupling arrangement further comprising a beam-forming metallic reflector surrounding the optical path of the semiconductor element, the beam-forming metallic reflector being arranged between the semiconductor element and the end face of the waveguide.

4. A coupling arrangement as claimed in claim 3, wherein the reflector comprises a metal layer disposed on surfaces of the submount surrounding the semiconductor element.

5. A coupling arrangement as claimed in claim 3, wherein the reflector comprises a metal layer formed on a wall of the coupling element between the end face of the waveguide and an end portion of the coupling element adjoining the semiconductor element.

6. A coupling arrangement as claimed in claim 4, wherein the reflector comprises a metal layer formed on a wall of the coupling element between the end face of the waveguide and an end portion of the coupling element adjoining the semiconductor element.

7. A coupling arrangement as claimed in claim 1, further comprising at least one cutout for accommodating at least one bond wire extending from the semiconductor element, the cutout being formed in at least one of the coupling element and the submount.

8. A coupling arrangement as claimed in claim 3, wherein the optical path is further defined as being between the semiconductor element and the end face of the waveguide, and wherein the reflector deflects the optical path by 90°.

9. A coupling arrangement as claimed in claim 1, wherein the waveguide comprises a glass fiber, the end portion of the waveguide adjoins the semiconductor element, and wherein the end portion is held by a highly precise ferrule receivably disposed in the recess formed in the submount.

10. A coupling arrangement as claimed in claim 1, wherein the submount is electrically conductive, the semiconductor element is electrically connected to the submount, and wherein the bottom side of the submount is electrically connected to the support.

11. A coupling arrangement for optically coupling an end in an end portion of an optical waveguide with at least one electro-optical or opto-electrical semiconductor element that optically opposes the end face of the waveguide, comprising:

a support having at least one conductor formed thereon;

means for electrically connecting the semiconductor element to the at least one conductor formed on the support;

a coupling element connected to the support, the coupling element comprising means for receiving the end portion of the optical waveguide;

a submount having a top side and a bottom side, the submount being fixed at its bottom side to the support and being electrically isolated from at least one conductor of the support, the submount comprising adjustment means for precisely adjusting a position of the semiconductor element;

means for fixing the semiconductor element in a thermally conductive manner to the submount; and, means for filling a space between the semiconductor element and a face of the end of the optical waveguide; is filled by a transparent adhesive, wherein the coupling element is positively aligned on the submount.

12. The coupling arrangement according to claim 11, wherein the means for electrically connecting the semiconductor element to the conductor comprise at least one bond wire.

13. The coupling arrangement according to claim 12, wherein the conductor that is connected to the at least one bond wire is electrically isolated from the submount.

14. The coupling arrangement according to claim 11, wherein the adjustment means are in the form of a recess adapted for precise adjustment of the semiconductor element.

15. The coupling arrangement according to claim 14, wherein the adjustment means are disposed on the top side of the submount.

16. The coupling arrangement according to claim 11, wherein the means for filling a space between the semiconductor element and a face of the end of the optical waveguide comprise a transparent adhesive.

17. An optical coupler for optically coupling an optical waveguide, having an end portion, with at least one electro-optical or opto-electrical semiconductor element that optically opposes an end face of the end portion, the optical waveguide being insertable into the optical coupler, the optical coupler comprising:

a support having at least one conductor formed thereon;

at least one semiconductor element disposed to optically oppose the end face of the waveguide, the semiconductor element being fixedly connected to the support;

a bond wire electrically connecting the semiconductor element to the conductor;

a coupling element connected to the support and adapted to receive the end portion of the optical waveguide;

a submount having a top and bottom side, the submount being fixed at its bottom side to the support, the submount having on its top side an adjustment structure in the form of a recess adapted for precise adjustment of the semiconductor element; and a transparent adhesive,
wherein the semiconductor element is fixed in a thermally conductive manner to the submount, the coupling element is positively aligned on the submount, at least that conductor of the support onto which the bond wire is connected is electrically isolated from the submount, and wherein a space, between the semiconductor element and the end face of an optical waveguide to be inserted, is adapted to be filled by the transparent adhesive.

* * * * *